(12) United States Patent
Lu et al.

(10) Patent No.: US 11,869,766 B2
(45) Date of Patent: *Jan. 9, 2024

(54) SEED LAYER FOR FERROELECTRIC MEMORY DEVICE AND MANUFACTURING METHOD THEREOF

(71) Applicant: TAIWAN SEMICONDUCTOR MANUFACTURING COMPANY LTD., Hsinchu (TW)

(72) Inventors: Chun-Chieh Lu, Taipei (TW); Sai-Hooi Yeong, Hsinchu County (TW); Yu-Ming Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/709,284

(22) Filed: Mar. 30, 2022

(65) Prior Publication Data
US 2022/0223413 A1 Jul. 14, 2022

Related U.S. Application Data

(63) Continuation of application No. 16/925,267, filed on Jul. 9, 2020, now Pat. No. 11,302,529.

(51) Int. Cl.
*H01L 21/02* (2006.01)
*H10B 51/30* (2023.01)

(52) U.S. Cl.
CPC .. *H01L 21/02516* (2013.01); *H01L 21/02472* (2013.01); *H10B 51/30* (2023.02)

(58) Field of Classification Search
None
See application file for complete search history.

(56) References Cited

U.S. PATENT DOCUMENTS

| 11,302,529 B2 * | 4/2022 | Lu | H01L 29/40111 |
| 2017/0162587 A1 * | 6/2017 | Chavan | H01L 29/78391 |

* cited by examiner

*Primary Examiner* — Benjamin P Sandvik
(74) *Attorney, Agent, or Firm* — WPAT LAW; Anthony King

(57) ABSTRACT

A method includes: providing a bottom layer; forming a first transistor over a substrate; forming a bottom electrode over the transistor; depositing a first seed layer over the bottom electrode; performing a surface treatment on the first seed layer, wherein after the surface treatment the first seed layer includes at least one of a tetragonal crystal phase and an orthorhombic crystal phase; depositing a dielectric layer over the bottom layer adjacent to the first seed layer, the dielectric layer including an amorphous crystal phase; depositing an upper layer over the dielectric layer; performing a thermal operation on the dielectric layer to thereby convert the dielectric layer into a ferroelectric layer.

20 Claims, 29 Drawing Sheets

US 11,869,766 B2

SEED LAYER FOR FERROELECTRIC MEMORY DEVICE AND MANUFACTURING METHOD THEREOF

PRIORITY CLAIM AND CROSS-REFERENCE

This application is a continuation of U.S. patent application Ser. No. 16/925,267 filed Jul. 9, 2020, the disclosure of which is hereby incorporated by reference in its entirety.

BACKGROUND

A random access memory (RAM) device includes memory cells that each memory cell stores a bit "0" or "1" of data when a write operation is performed thereon that can be retrieved later by performing a read operation. In RAM devices, the amount of time to write data thereto is about the same as the amount of time to read data therefrom. A RAM device can be a volatile type or a non-volatile type. The volatile type RAM devices require power to retain data stored therein. As opposed to the volatile type RAM device, the non-volatile type RAM ensures data retention even after the power is removed. A memory cell of the volatile RAM device, such as a dynamic RAM (DRAM), includes a capacitor that is either in a charged state or a discharged state. These two electrical states respectively represent the two logic states of data.

Ferroelectric RAM (FeRAM) device is another type of RAM similar in construction to DRAM but using a ferroelectric layer instead of a dielectric layer to achieve non-volatility. Generally, the FeRAM provides better speed, lower power, and improved data reliability than conventional RAM devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
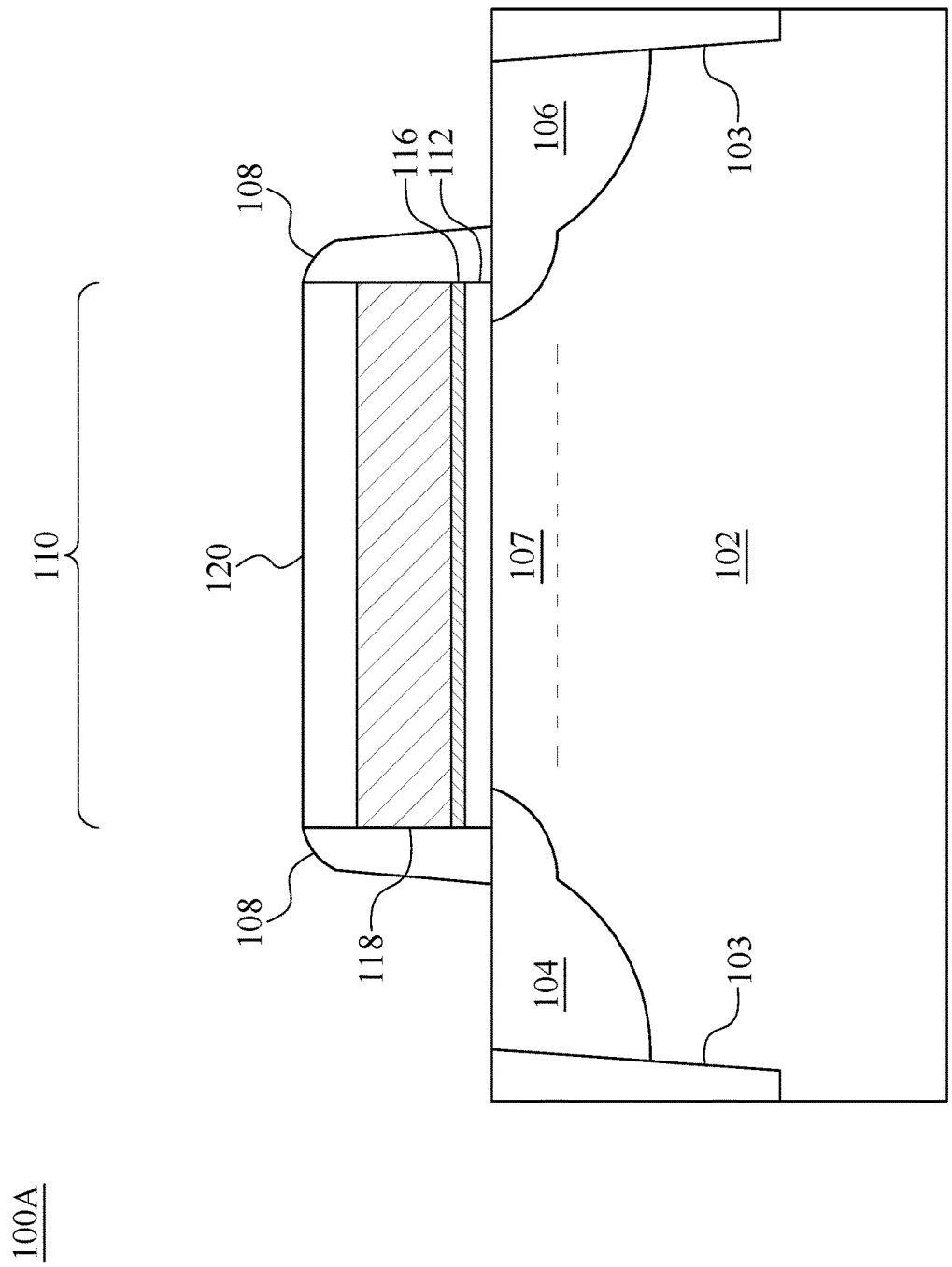
FIGS. 1A to 1D are cross-sectional views of a ferroelectric random-access memory (FeRAM) device, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Ferroelectricity is a characteristic of certain materials that have a spontaneous electric polarization which can be reversed by the application of an external electric field. The feature of spontaneous polarization of ferroelectric materials implies a hysteresis effect, in which different polarizations in a hysteresis loop can be used to represent non-volatile states of a bit in a memory device, e.g., ferroelectric capacitors are used to form ferroelectric RAM (FeRAM) or ferroelectric field-effect transistor (FeFET) devices.

Modern semiconductor devices typically include an array of RAM cells, including the FeRAM cells, as embedded RAM. A semiconductor circuit with embedded RAM cells may define a memory region and a logic region separated from the memory region. For example, the memory region may be located at the center of the aforesaid semiconductor circuit while the logic region may locate at a periphery of the semiconductor circuit. Note the previous statement is not intended to be limiting. Other arrangement regarding the memory region and the logic region or other arrangements of the RAM cells are enclosed in the contemplated scope of the present disclosure.

In some embodiments, transistors may be formed in the memory region and the logic region, disposed in a common semiconductor substrate and prepared in a front-end-of-line (FEOL) stage. In some embodiments, the FeRAM cell is embedded in a metallization layer, or interconnect layer, over the transistor layer in the memory region and prepared in a back-end-of-line (BEOL) stage subsequent to the FEOL stage. The FeRAM cell can be embedded in any position of the metallization layer, for example, between adjacent metal line layers distributed horizontally parallel to a surface of the semiconductor substrate. For instance, the embedded FeRAM can be located in the third metal line layer and the fourth metal line layer in a memory region. Horizontally shifted to the logic region, the metal line in the third metal line layer is connected to the metal line in the fourth metal line layer though a metal via in a third metal via layer between the third and fourth metal line layers. In general, the FeRAM is located between an Nth metal line layer and an (N+1)th metal line layer and may be manufactured in an intermediate stage of forming the metallization layer. People having ordinary skill in the art can understand that the numbers provided for the metal line layers and the arrangement of the FeRAM in the metallization layer described herein are not limiting.

Existing methods of forming the ferroelectric materials require a thermal or annealing operation followed by a cooling operation for transforming a dielectric material into a ferroelectric dielectric material. The temperature of the thermal or annealing operation may be greater than the temperature limit below which the integrity of the metal lines or metal vias, for example, formed of copper, can be maintained. In order to prevent the as-formed metal lines and metal vias from being damaged by the annealing operation for forming the ferroelectric materials of the FeRAM, the operation temperature at which the ferroelectric materials are formed is thus lowered, thereby degrading the polarization performance of the resultant ferroelectric dielectric materials in the FeRAM.

Accordingly, the present disclosure proposes a seed layer for facilitating the formation of the ferroelectric layer of the FeRAM in which the formation temperature of the ferroelectric materials can be lowered. By help of such seed layer, the FeRAM can be manufactured in an annealing temperature substantially equal to less than the temperature limit at which the metal lines and metal vias can function properly. The dielectric material is formed on the seed layer having a well-controlled crystal phase. As a result, the crystal phase of the ferroelectric dielectric material after the annealing and cooling operation can be transformed under a lower temperature than that of existing methods through the well-controlled crystal phase in the seed layer. The performance of the FeRAM can be improved while keeping the device integrity of the metal lines and metal vias.

FIG. 1A is a cross-sectional view of a ferroelectric random-access memory (FeRAM) device 100A, in accordance with various embodiments of the present disclosure. In some embodiments, the FeRAM device 100A is referred to as a FeRAM device or a FeFET device. In some embodiments, the ReRAM device 100A can be used as a negative-capacitance field-effect transistor (NCFET). Referring to FIG. 1A, the semiconductor structure of the FeRAM device 100A includes a substrate 102, isolation regions 103, two doped regions 104 and 106, two spacers and a gate structure 110.

The substrate 102 is a silicon substrate in the depicted embodiment. In some other embodiments, the substrate 102 is other semiconductor materials such as germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, and the like, may also be used. Additionally, the substrate 102 may include a silicon-on-insulator (SOI) substrate. Generally, an SOI substrate includes a layer of semiconductor material such as epitaxial silicon, germanium, silicon germanium, silicon germanium on insulator (SGOI), or combinations thereof. In some embodiments, the substrate 102 is a single crystal material. The substrate 102 may be doped with a p-type dopant such as boron, boron fluorine, aluminum, gallium, or the like. The substrate 102 may alternatively be doped with an n-type dopant such as phosphorus, arsenic, antimony, or the like.

In some embodiments, the substrate 102 includes two doped regions 104 and 106 of a first conductivity type. The first conductivity type is n-type or p-type. In some embodiments, the doped regions 104 and 106 are a source region and a drain region, respectively. A channel region 107 may be formed in the substrate 102 adjacent to the surface of the substrate 102 between the doped regions 104 and 106. In some embodiments, the channel region 107 is undoped or lightly doped. A write current or read current is formed in the channel region 107 through a proper biasing voltage on the doped regions 104 and 106, thereby causing the data to be read out or written into the FeRAM.

Isolation regions 103 are formed in the substrate 102. In some embodiments, the isolation regions 103 define an active region of the FeRAM device 100A, in which the active region includes the doped regions 104 and 106. In some embodiments, the isolation regions 103 form a ring structure viewed from above. The isolation region 103 may be formed of dielectric materials, such as silicon oxide, silicon nitride, silicon carbide, silicon oxynitride, or the like.

Two spacers 108 are formed over the substrate 102 and laterally surrounding the gate structure 110. In some embodiments, the spacers 108 is formed of one or more dielectric materials, such as silicon oxide, silicon nitride, silicon carbide, silicon oxynitride, or the like. In some embodiments, the spacers 108 have a multilayer structure.

The gate structure 110 is arranged over the substrate 102 between the doped regions 104 and 106. The gate structure 110 is also laterally surrounded by the spacers 108. The FeRAM device 100A in the present embodiment includes a Metal-Ferroelectric-Insulator-Semiconductor (MFIS) structure. Accordingly, the gate structure 110 includes a capping layer 120, a ferroelectric layer 118, an interfacial layer 112 and the substrate 102 arranged over one another and corresponding to the four component layers of the MFIS structures.

In some embodiments, the interfacial layer 112 is formed directly over the substrate 102. In some embodiments, the interfacial layer 112 is laterally surrounded by the spacers 108. The interfacial layer 112 may have an amorphous crystal structure. In some embodiments, the interfacial layer 112 includes a dielectric material, such as HfO, TiN, SiO$_2$, Si$_3$N$_4$, SiON, or combinations thereof. In some embodiments, the interfacial layer 112 has a thickness between about 10 to about 20 Å. In some embodiments, the interfacial layer 112 is formed of a high-k dielectric material such as HfO$_2$, HfErO, HfLaO, HfYO, HfGdO, HfAlO, HfZrO, HfTiO, HfTaO, ZrO$_2$, Y$_2$O$_3$, La$_2$O$_5$, Gd$_2$O$_5$, TiO$_2$, Ta$_2$O$_5$, SrTiO, or combinations thereof.

A ferroelectric layer 118 is formed over the interfacial layer 112. In some embodiments, the ferroelectric layer 118 covers the entire interfacial layer 112. In some embodiments, the ferroelectric layer 118 is laterally surrounded by the spacers 108. The ferroelectric layer 118 may be formed of ferroelectric materials, such as hafnium (Hf) oxide with dopants of varying percentages. The dopants may include semiconductor materials, such as silicon (Si), or metallic materials, such as zirconium (Zr), gadolinium (Gd), aluminum (Al), yttrium (Y), strontium (Sr), lanthanum (La), or the like. In some embodiments, the ferroelectric layer 118 has a thickness between about 5 nm and about 50 nm, or between about 10 nm and about 30 nm.

The ferroelectric layer 118 is normally in a single crystal or a polycrystalline structure. In some embodiments, the ferroelectric layer 118 includes a ferroelectric phase, such as an orthorhombic crystal phase, in which oxygen atoms are arranged to form intrinsic polarizations in response to external electric fields. In some embodiments, a percentage of the orthorhombic phase of the ferroelectric layer 118 is in a range between about 35% and 75%, between about 40% and about 70% or between about 50% and 70%, according to various embodiments. In some embodiments, the ferroelectric layer 118 further includes at least one of a tetragonal phase and a monoclinic phase.

The capping layer 120 is disposed over the ferroelectric layer 118. In some embodiments, the capping layer 120 covers the entire ferroelectric layer 118. In some embodiments, the capping layer 120 is laterally surrounded by the spacers 108. In some embodiments, the capping layer 120 is formed of conductive materials such as titanium nitride (TiN), tantalum nitride (TaN), tungsten (W), ruthenium (Ru), or the like. In some embodiments, the capping layer 120 has a thickness between about 50 nm and about 300 nm, or between 50 nm and 200 nm. During operation, the capping layer 120 and the doped regions 104/106 serves as electrodes of the MFIS-type FeRAM, in which an electric field is provided onto two sides of the ferroelectric layer 118 through the capping layer 120 and channel region 107, which conducts current between the doped regions 104/106.

Referring to FIG. 1A, the FeRAM device 100A further includes a seed layer 116 between the interfacial layer 112 and the ferroelectric layer 118. In some embodiments, a lower surface of the ferroelectric layer 118 is in contact with an upper surface of the seed layer 116. In some embodiments, the ferroelectric layer 118 covers the entire seed layer 116. The seed layer 116 may be formed of a dielectric layer. In some embodiments, the seed layer 116 and the ferroelectric layer 118 are formed of metal oxides in which the metals for forming the seed layer 116 and the ferroelectric layer 118 belong to the same group of the periodic table or and have similar atomic orbital configurations. For example, the ferroelectric layer 118 is formed of HfO$_2$ and the seed layer 116 is formed of ZrO$_2$, wherein Zr and Hf are both elements in group IV of the periodic table. In some embodiments, the seed layer 116 is formed of an oxide form of metallic materials that tend to form tetragonal or orthorhombic phases, such as Al$_2$O$_3$, MgO, or the like. In some embodiments, the seed layer is formed of silicon dioxide (SiO$_2$).

In some embodiments, the seed layer 116 includes a polycrystalline structure having an orthorhombic crystal phase or a tetragonal phase, which can aid in achieving an orthorhombic crystal phase during the formation of the adjacent ferroelectric layer 118. In some embodiments, the seed layer has orthorhombic phase with a percentage greater than about 30% or greater than about 50%. In some embodiments, a percentage sum of the orthorhombic phase and the tetragonal phase of the seed layer 116 is more than about 60%, more than 70%, or more than 80%, according to various embodiments. If the percentage sum of the orthorhombic phase and the tetragonal phase is less than about 60%, the performance of facilitating the formation of the orthorhombic ferroelectric layer 118 may not meet the requirements. In some embodiments, the seed layer 116 further includes a monoclinic phase. In some embodiments, a percentage of the orthorhombic phase ferroelectric layer 118 is in a range between about 35% and 75%, between about 40% and about 70% or between about 50% and 70%, according to various embodiments.

In some embodiments, the seed layer 116 has a thickness less than about 2 nm such that the desirable orthorhombic or tetragonal crystal phase can be obtained smoothly during the deposition or treatment of the seed layer 116. In some embodiments, the thickness of the seed layer 116 is between about 0.5 nm and about 5 nm, between about 0.5 nm and about 2 nm, or between 0.5 nm and about 1 nm.

Figure 1B:
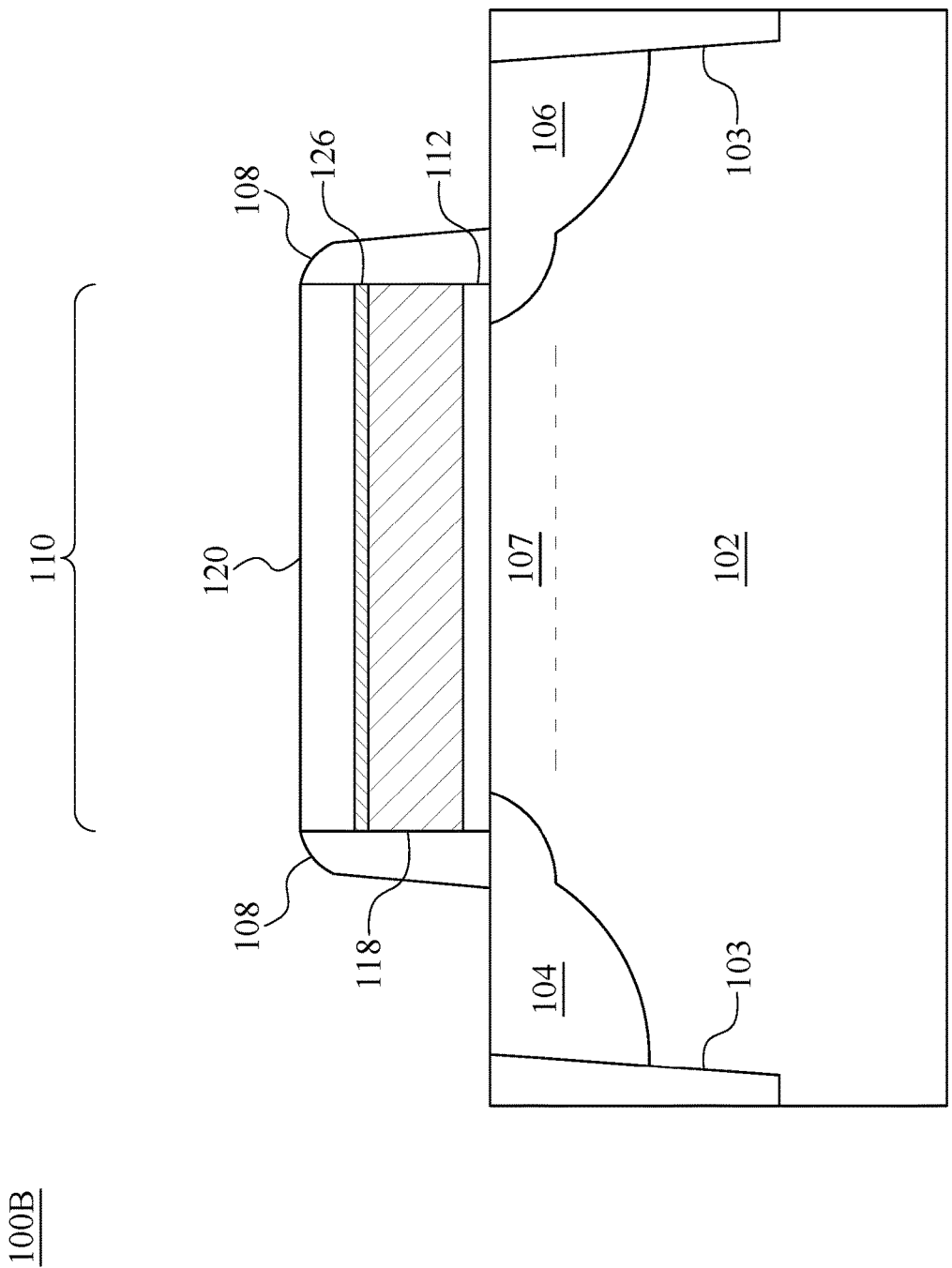

FIG. 1B is a cross-sectional view of a ferroelectric random-access memory (FeRAM) device 100B, in accordance with various embodiments of the present disclosure. In some embodiments, the FeRAM device 100B is a FeRAM cell. The FeRAM device 100B is similar to the FeRAM device 100A in many aspects, and the descriptions of these aspects are not repeated for brevity. The FeRAM device 100B differs from the FeRAM device 100A at least by a seed layer 126 disposed between the capping layer 120 and the ferroelectric layer 118. In some embodiments, the capping layer 120 is in contact with an upper surface of the seed layer 126. In some embodiments, a lower surface of the seed layer 126 is in contact with an upper surface of the ferroelectric layer 118. In some embodiments, the seed layer 126 covers the entire ferroelectric layer 118. In some embodiments, the dimensions, materials and method of forming for the seed layer 126 are similar to those of the seed layer 116.

Figure 1C:
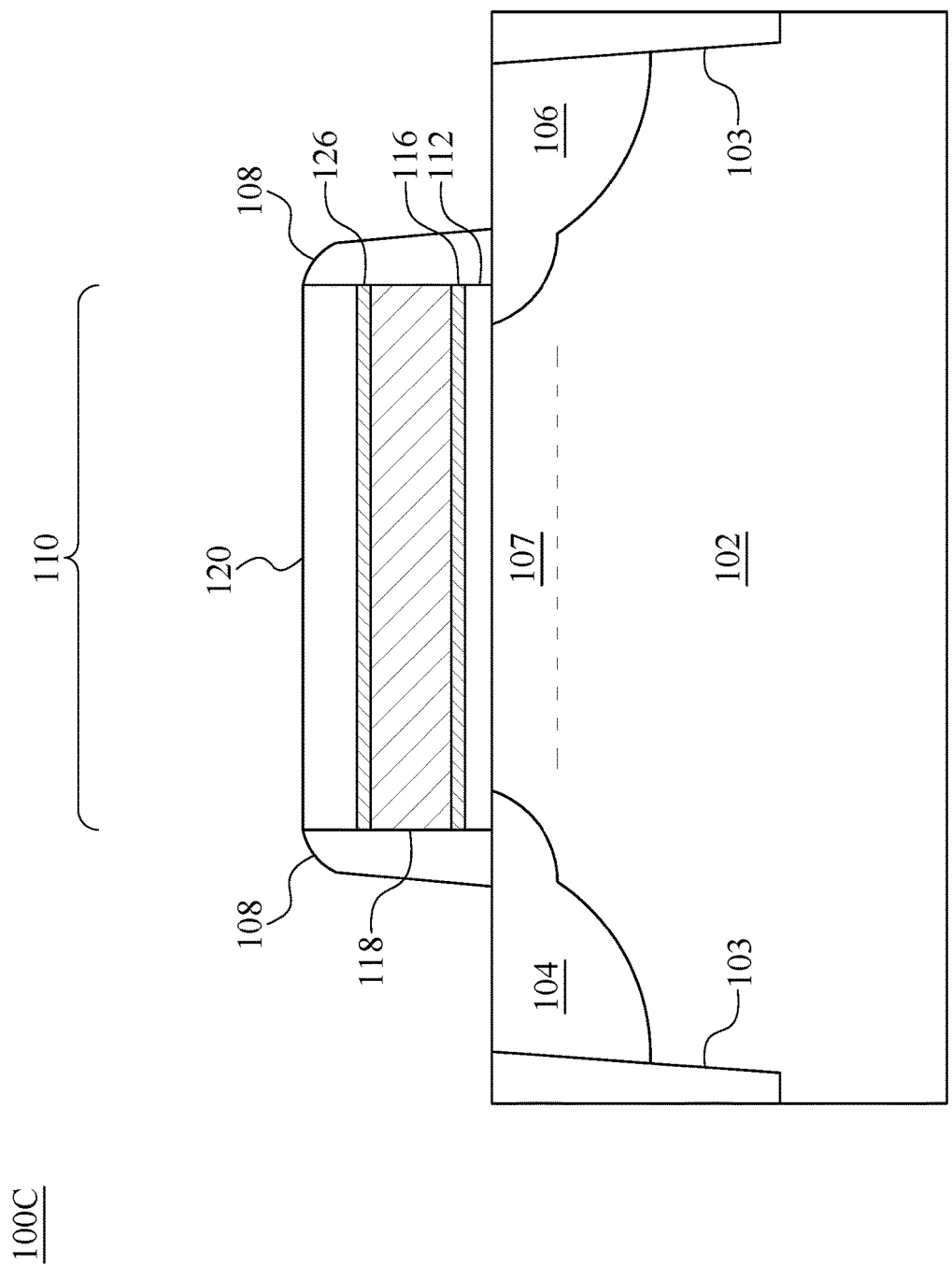

FIG. 1C is a cross-sectional view of a ferroelectric random-access memory (FeRAM) device 100C, in accordance with various embodiments of the present disclosure. In some embodiments, the FeRAM device 100C is a FeRAM cell. The FeRAM device 100C is similar to the FeRAM devices 100A and 100B in many aspects, and the descriptions of these aspects are not repeated for brevity. The FeRAM device 100C can be seen as a combination of the FeRAM devices 100A and 100B, in which the FeRAM device 100C includes a seed layer 116 and a seed layer 126. The seed layer 116 is disposed between the interfacial layer 112 and the ferroelectric layer 118 while the seed layer 126 is disposed between the capping layer 120 and the ferroelectric layer 118. In some embodiments, the ferroelectric layer 118 is sandwiched between the seed layers 116 and 126. In some embodiments, the ferroelectric layer 118 is in contact with the seed layers 116 and 126 from a lower surface and an upper surface, respectively, of the ferroelectric layer 118.

Figure 1D:
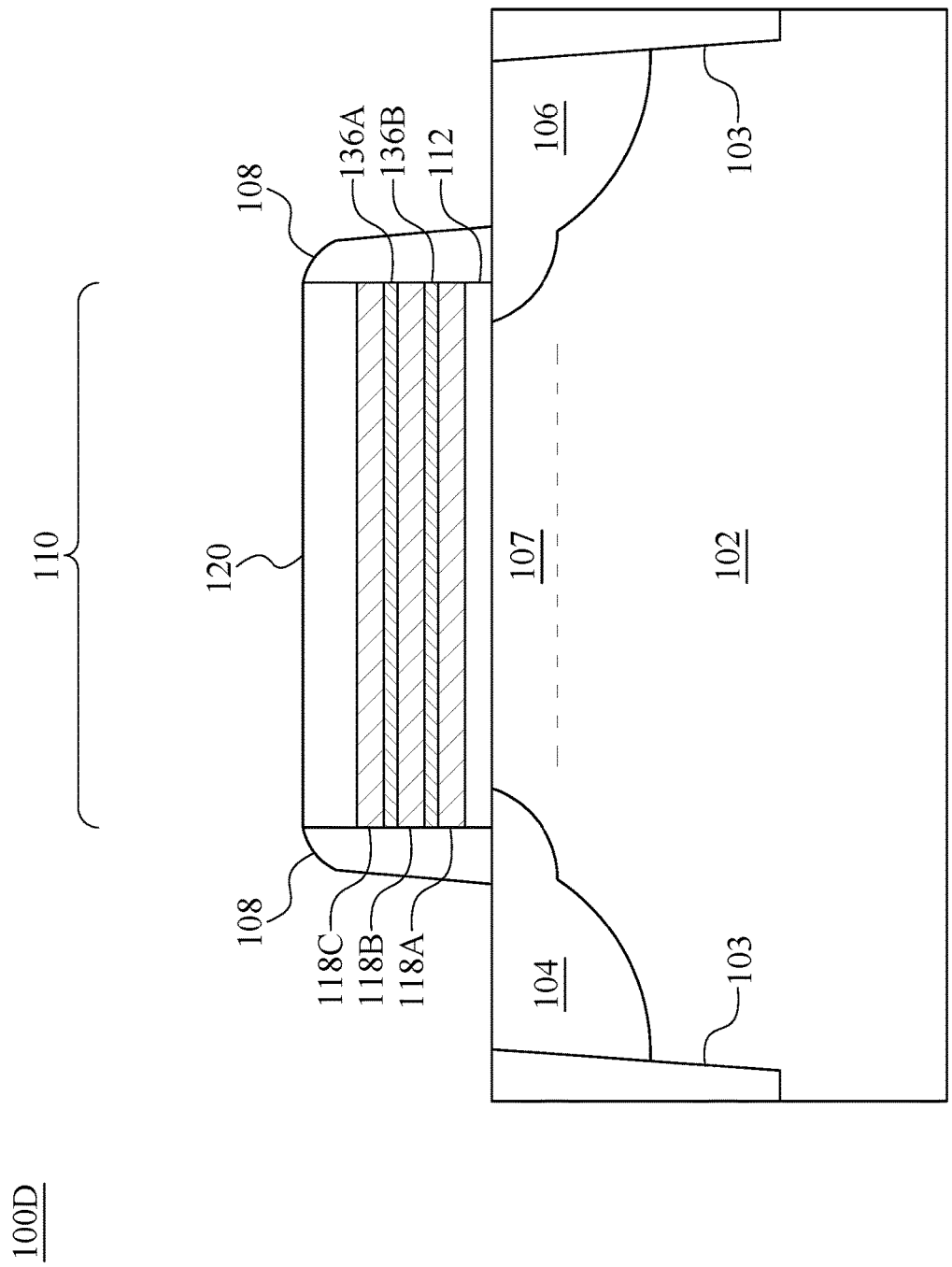

FIG. 1D is a cross-sectional view of a ferroelectric random-access memory (FeRAM) device 100D, in accordance with various embodiments of the present disclosure.

In some embodiments, the FeRAM device 100D is a FeRAM cell. The FeRAM device 100D is similar to the FeRAM devices 100A to 100C in many aspects, and the descriptions of these aspects are not repeated for brevity. The FeRAM device 100D can be seen as another variant of the FeRAM devices 100A to 100C, in which the ferroelectric layers 118 includes portions 118A, 118B and 118C, and the FeRAM device 100D includes one or more seed layers 136 (e.g., 136A and 136B) embedded in the ferroelectric layer 118 between the portions 118A, 118B and 118C. In some embodiments, the FeRAM device 100D includes only one seed layer 136 embedded within the ferroelectric layer 118, in which the upper surface and the lower surface of the only seed layer 136 are in contact with the ferroelectric layer 118. In some embodiments, the dimensions, materials and method of forming for the seed layer 136 are similar to those of the seed layer 116 or 126.

The configurations of the seed layer 116, 126 and 136 described with reference to FIGS. 1A to 1D are not limiting. Other types of arrangements of the seed layers 116, 126 and 136 are also within the contemplated scope of the present disclosure. In some embodiments, at least one surface of the seed layer 116, 126 or 136 is in contact with the ferroelectric layer 118 for providing a crystal-growing surface having a prepared orthorhombic or tetragonal phase to thereby facilitating the formation of the orthorhombic phase in the ferroelectric layer 118. For example, the combination of FIG. 1D with one of FIGS. 1A to 1C is also possible. In some embodiments, a total thickness of the seed layers 116, 126 and 136 of the FeRAM devices 100A to 100D is less than 4 nm or less than 3 nm in order to maintain desirable electrical performance of the FeRAM during a read or write operation. In some embodiments, a ratio of a first thickness of the material contributed by the seed layer 116, 126 and 136 and a second thickness of the ferroelectric layer 118 is between about 5% and about 25%, or between about 10% and about 20%.

FIGS. 2A to 2E are cross-sectional views of intermediate stages of a method for manufacturing a semiconductor structure 200, in accordance with some embodiments of the present disclosure. Materials, configurations, dimensions or processes the same as or similar to those described in foregoing embodiments may be applied to the following embodiments, and detailed explanations thereof may be omitted for brevity. It should be understood that additional steps can be provided before, during, and after the steps shown in the following embodiment, and some of the steps described below can be replaced or eliminated in other embodiments. The order of the steps may be interchangeable. In some embodiments, the semiconductor structure 200 corresponds to the gate structure 110 shown in FIG. 1A to FIG. 1D.

Figure 2A:
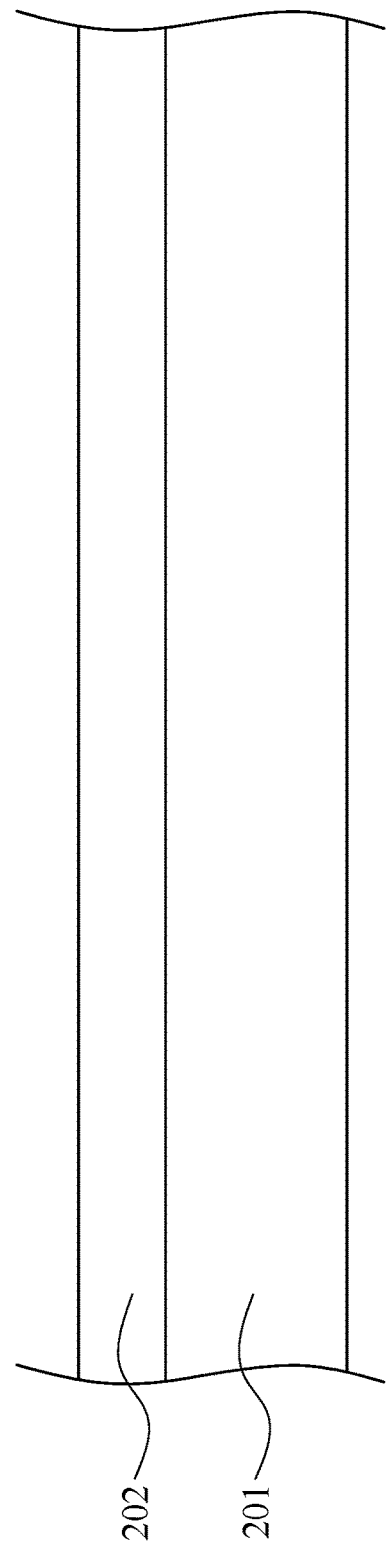
FIGS. 2A to 2E are cross-sectional views of intermediate stages of a method for manufacturing a semiconductor structure, in accordance with some embodiments of the present disclosure.

Referring to FIG. 2A, a substrate 201 is provided. The substrate 201 is a semiconductor substrate and may be similar to the substrate 102 shown in FIGS. 1A to 1D. A bottom layer 202 is formed or provided over the substrate 201. The bottom layer 202 is formed or provided such that the ferroelectric layer 118 or the seed layer 116 can be formed thereon. In some embodiments, the bottom layer 202 is a dielectric layer, e.g., the interfacial layer 112 shown in FIGS. 1A to 1D. In some other embodiments, the bottom layer 202 serves as a bottom electrode (see the bottom electrode 512 in FIG. 5E) of a Metal-Ferroelectric-Metal (MFM) type of FeRAM, in which the bottom layer 202 is formed over a substrate (see the substrate 410 shown in FIG. 5E) and includes a conductive material, such as titanium nitride (TiN), tantalum nitride (TaN), tungsten (W), ruthenium (Ru), or the like. In some embodiments, the bottom layer 202 is formed using physical vapor deposition (PVD), chemical vapor deposition (CVD), atomic layer deposition (ALD), metal organic deposition (MOD), plasma enhanced chemical vapor deposition (PECVD), or the like.

Figure 2B:
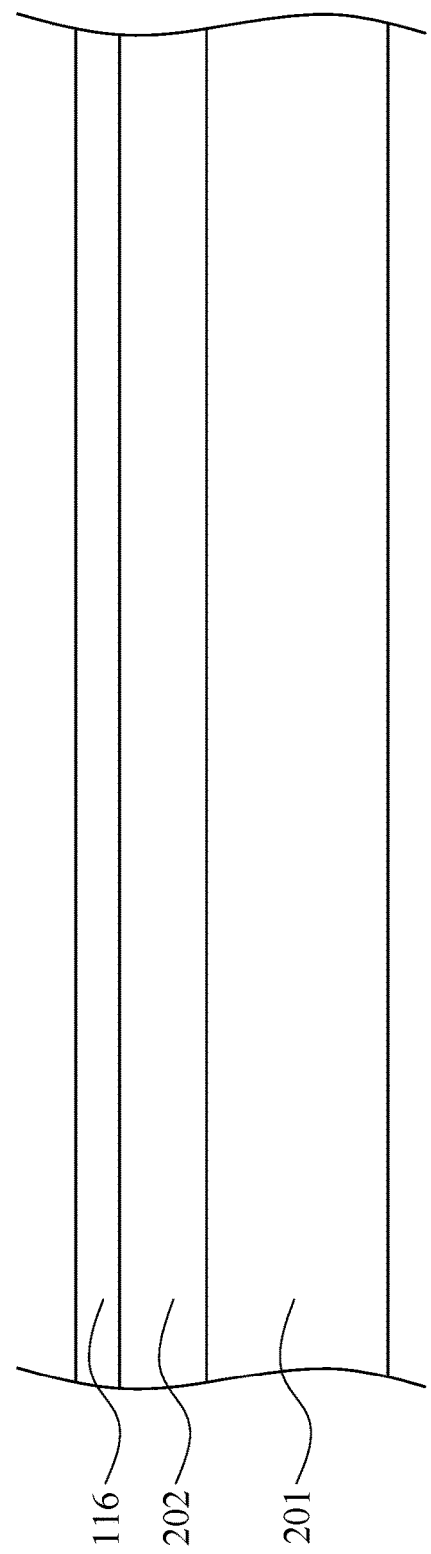

Referring to FIG. 2B, a seed layer 116 is deposited over the bottom layer 202. In some embodiments, the seed layer 116 is deposited using CVD, ALD, PVD, or the like. In some embodiments, the deposited seed layer 116 includes an amorphous crystal phase. In some other embodiments, the seed layer 116 is deposited using remote-plasma ALD (RPALD) for supplying thermal stress to form a tetragonal or orthorhombic crystal phase in the seed layer 116. When the RPALD is used to deposit the seed layer 116, free radicals are leveraged to facilitate the formation of the seed layer 116 without the adverse effect caused by plasma bombardment. In some embodiments, the seed layer 116 is formed at a temperature between about 200° C. and about 400° C.

Figure 2C:
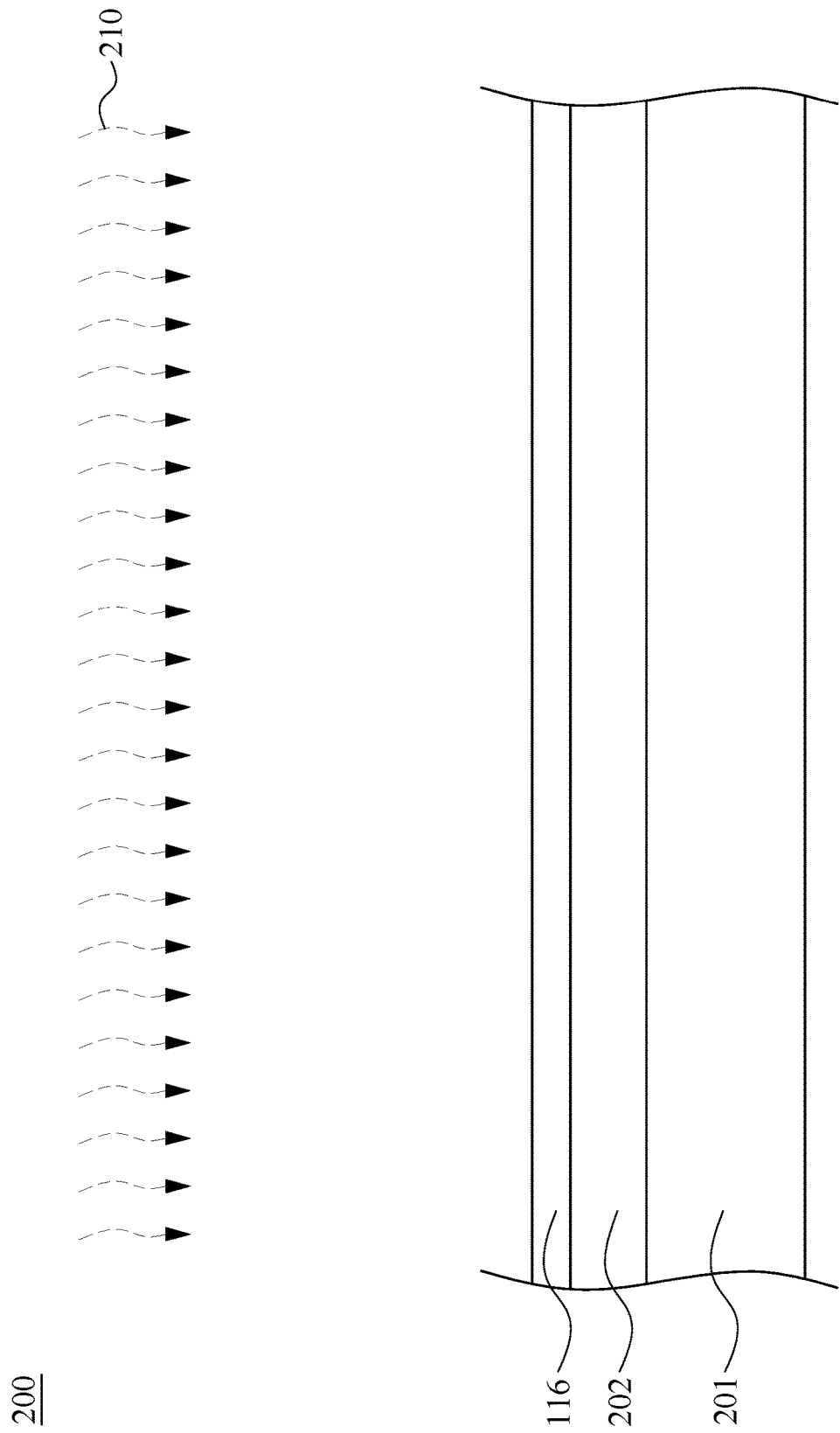

FIG. 2C illustrates a surface treatment 210 on the as-deposited seed layer 116. In embodiments where the seed layer 116 as deposited has an amorphous crystal phase, the surface treatment 210 includes an annealing operation, a plasma treatment or a combination thereof. The surface treatment 210 can supply thermal stress to the entire seed layer 116 to transform the amorphous crystal phase of the seed layer 116 into the tetragonal or orthorhombic crystal phase. The processed seed layer 116 provides a well-controlled crystal structure suitable to serve as a crystallization template and transform the subsequently-formed ferroelectric layer 118 into one having the orthorhombic phase. In some embodiments, the plasma treatment supplies thermal stress through the plasma bombardment for forming the tetragonal or orthorhombic crystal phase at a temperature less than that for the annealing operation. In some embodiments, the surface treatment is performed at a temperature between about 200° C. and about 400° C. In some embodiments, the deposition and surface treatment 210 are performed in a single operation shown in FIG. 2B, and thus the step shown in FIG. 2C is omitted.

Figure 2D:
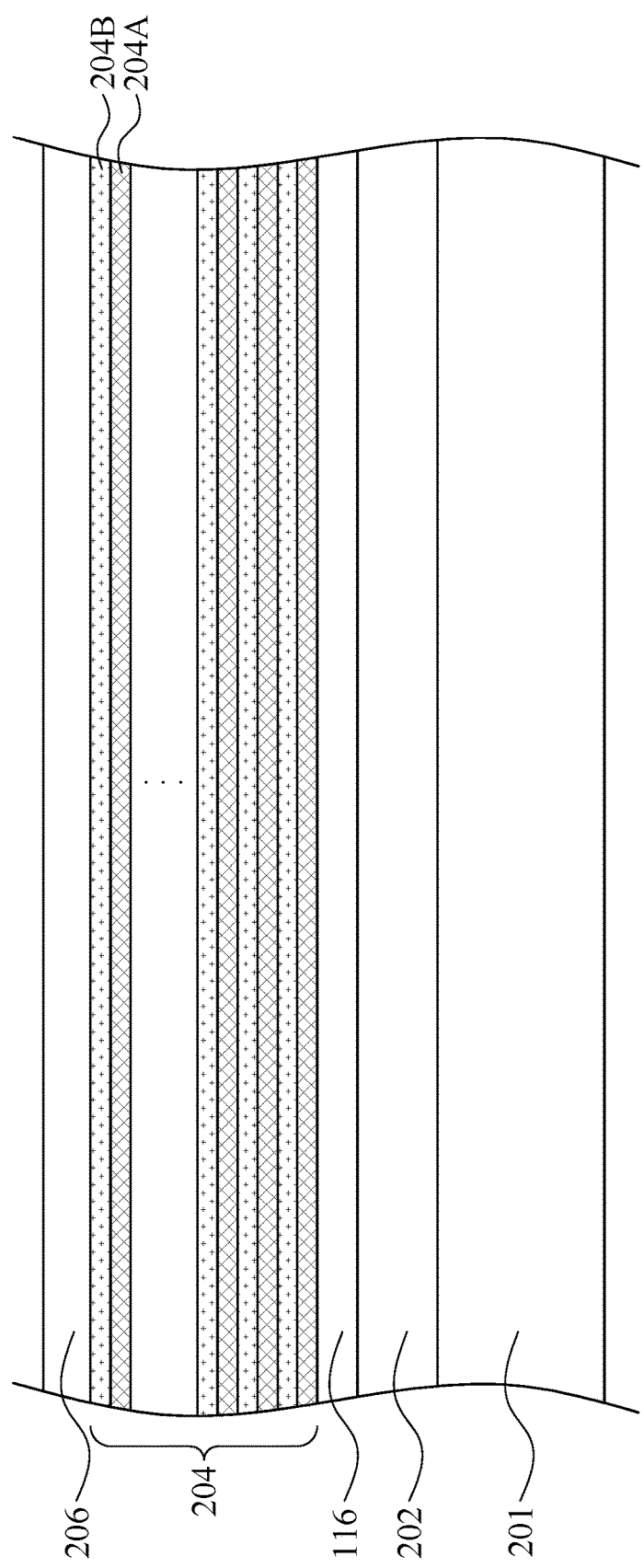

Referring to FIG. 2D, a dielectric layer 204 is deposited over the seed layer 116. In some embodiments, the dielectric layer 204 is an Hf-based dielectric layer. The dielectric layer 204 may include a layer of $HfO_2$ 204A with various dopants, such as Si, Zr, Gd, Al, Y, Sr and La. In some other embodiments, the dielectric layer 204 is formed of a layer stack formed of a plurality of component layers. For example, a plurality of $HfO_2$ layers 204A are alternatingly arranged with a plurality of dopant layers 204B, in which each the dopant layer 204B may be an oxide form of the dopants selected from the group of Si, Zr, Gd, Al, Y, Sr and La. In some embodiments, different dopant layers 204B may include the same or different dopants. The number of the pairs of layers 204A/204B may be between 5 and 20. In some embodiments, the dielectric layer 204, including the component layers 204A and 204B, is formed by CVD, PVD, PECVD, ALD, or other suitable deposition operations.

An upper layer 206 is formed over the dielectric layer 204. In some embodiments, the upper layer 206 is the capping layer 120 shown in FIGS. 1A to 1D. In some other embodiments, the upper layer 206 serves as a top electrode of the MFM type FeRAM, in which the upper layer 206 includes a conductive material, such as titanium nitride (TiN), tantalum nitride (TaN), tungsten (W), ruthenium (Ru), or the like. In some embodiments, the upper layer 206 is formed using physical vapor deposition (PVD), chemical vapor deposition (CVD), atomic layer deposition (ALD), metal organic deposition (MOD), plasma enhanced chemical vapor deposition (PECVD), or the like. In some embodiments, the upper layer 206 is configured to provide a driving force for facilitating the transformation of the amorphous crystal phase of the dielectric layer 204 into an orthorhombic crystal phase during an annealing operation.

Figure 2E:
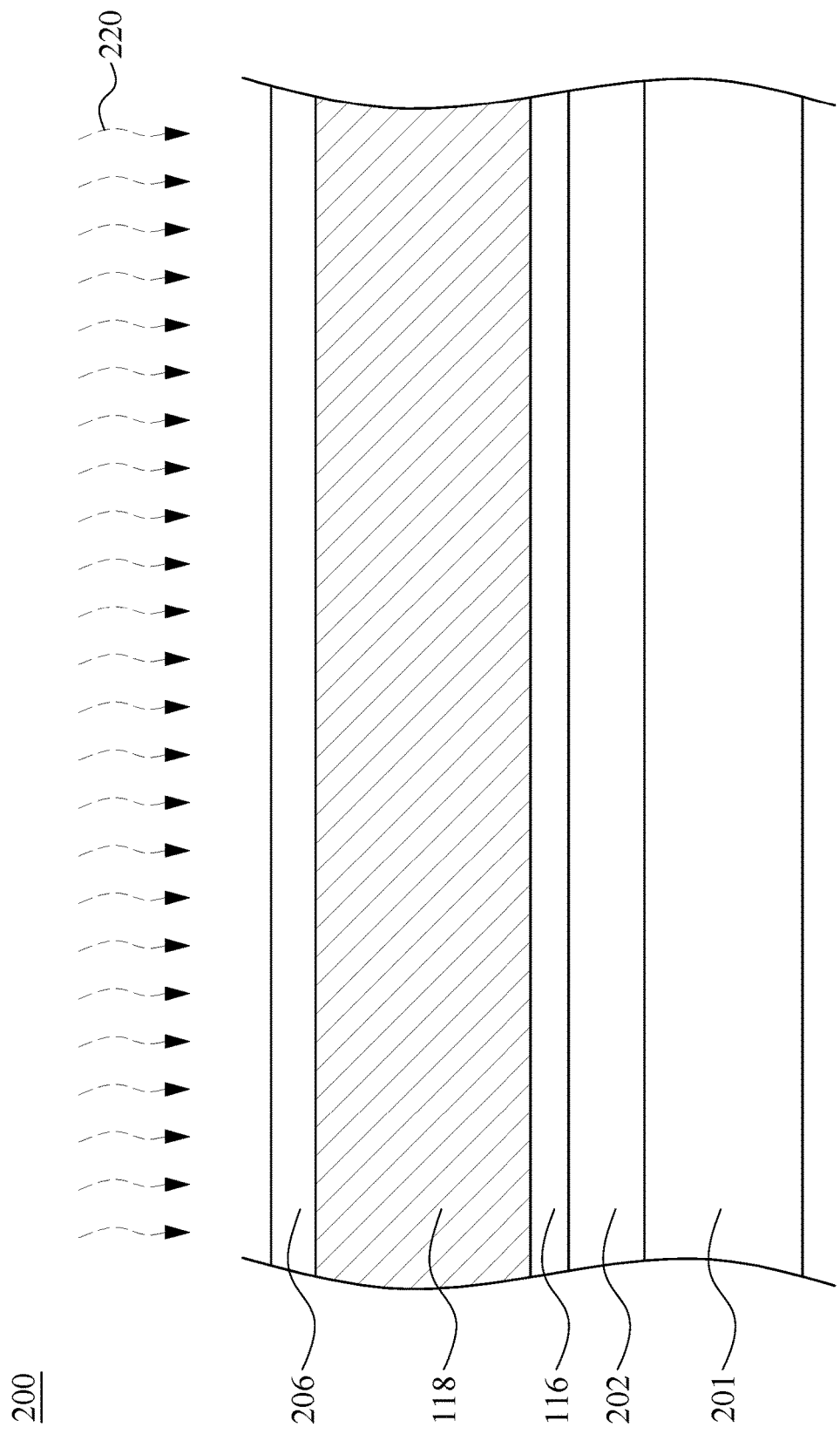

FIG. 2E shows a thermal operation 220 for transforming the amorphous crystal phase of the dielectric layer 204 into a high-temperature tetragonal crystal phase. In some embodiments, a cooling operation is performed subsequent to the thermal operation 220 to aid in the transformation from the high-temperature tetragonal crystal phase into the high-pressure ferroelectric orthorhombic crystal phase. The orthorhombic crystal phase has a non-centrosymmetric structure, and thus spontaneous polarization is generated by four oxygen ions displacement. The cooling operation may lower the temperature of the thermal operation 220 to below about 100° C., e.g., at a room temperature of about 25° C. After the thermal operation 220 and the cooling operation, the dielectric layer 204 becomes a ferroelectric layer or a ferroelectric dielectric layer 118 by help of the upper layer 206 serving as the capping layer, as shown in FIGS. 1A to 1D. In some embodiments, a portion of the dielectric layer 204 having the tetragonal crystal phase or monoclinic crystal phase, or a mixture thereof, is left in the dielectric layer 204 due to unsuccessful phase transformation. In some embodiments, the thermal operation 220 is an annealing operation, such as rapid thermal anneal (RTA) or furnace annealing. In some embodiments, the thermal operation is performed at a temperature below about 550° C., such as between about 450° C. and 550° C., e.g., at about 500° C.

In some embodiments, the seed layer 116, 126 or 136 includes a dielectric material the same as the materials used in the dielectric layer 204, e.g., $ZrO_2$. In such cases, after the thermal operation 220 and the subsequent cooling operation, at least a portion or the entirety of the seed layer 116, 126 or 136 is transformed into a ferroelectric layer having an orthorhombic crystal phase. In other words, at least a portion of the seed layer 116, 126 or 136 functions as a ferroelectric layer.

As described previously, existing approaches of forming the ferroelectric layer 118 are forced to lower the temperature of the thermal operation 220 for protecting the metal lines or metal vias, which are generally formed of copper in the BEOL stage prior to the annealing operation 220, at the cost of degrading the ferroelectricity performance of the ferroelectric layer 118. Through the incorporation of the seed layer 116 with its well-controlled tetragonal or orthorhombic crystal phase, the annealing operation 220 can be performed at a temperature lower than the annealing temperature at which the ferroelectric layer 118 is formed absent the seed layer 116. The metal lines and metal vias can be protected from being damaged by the high temperature otherwise employed in an existing method while the performance of the ferroelectric layer 118 can be maintained.

FIGS. 3A to 3F are cross-sectional views of intermediate stages of a method for manufacturing a semiconductor structure 300, in accordance with some embodiments of the present disclosure. Materials, configurations, dimensions or processes the same as or similar to those described in foregoing embodiments may be applied to the following embodiments, and detailed explanations thereof may be omitted for brevity. It should be understood that additional steps can be provided before, during, and after the steps shown in the following embodiment, and some of the steps described below can be replaced or eliminated in other embodiments. The order of the steps may be interchangeable.

Figure 3A:
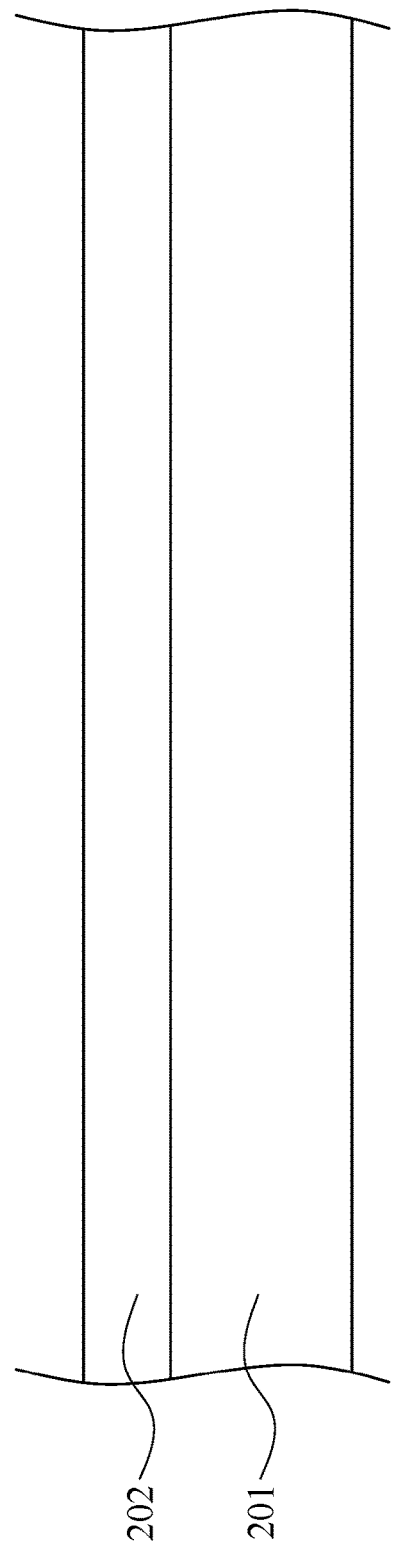
FIGS. 3A to 3F are cross-sectional views of intermediate stages of a method for manufacturing a semiconductor structure, in accordance with some embodiments of the present disclosure.

Referring to FIG. 3A, a bottom layer 202 is formed or provided, in a manner similar to that shown in FIG. 2A.

Figure 3B:
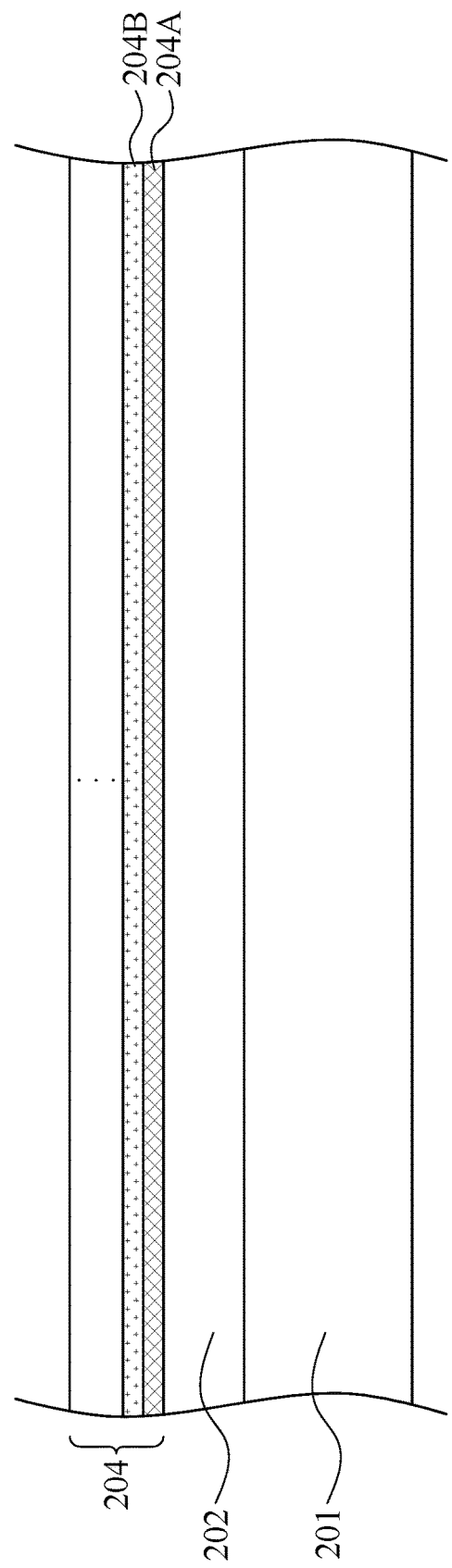

Referring to FIG. 3B, a dielectric layer 204 is deposited over the bottom layer 202 in a manner similar to that shown in FIG. 2D. In some embodiments, the dielectric layer 204 includes a layer of $HfO_2$ 204A with various dopants, such as Si, Zr, Gd, Al, Y, Sr and La. In some other embodiments, the dielectric layer 204 is formed of a layer stack formed of a plurality of component layers. For example, a plurality of $HfO_2$ layers 204A are alternatingly arranged with a plurality of dopant layers 204B, in which each the dopant layer 204B may be an oxide form of the dopants selected from the group of Si, Zr, Gd, Al, Y, Sr and La. In some embodiments, different dopant layers 204B may include the same or different dopants.

Figure 3C:
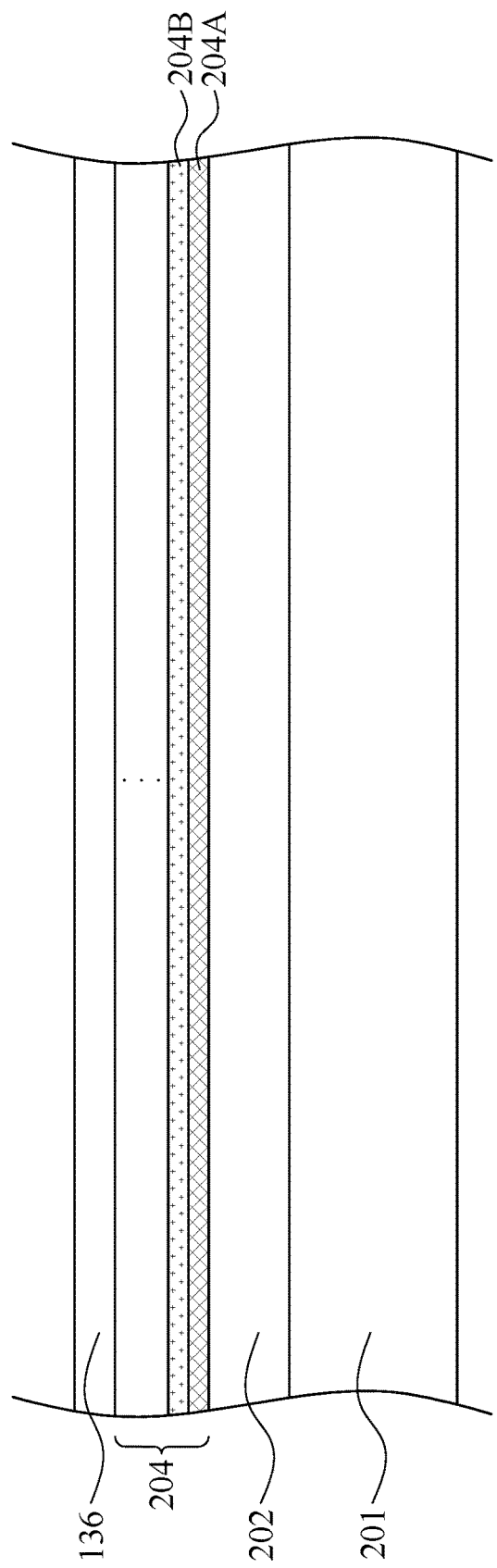

Referring to FIG. 3C, a seed layer 136 is deposited over the dielectric layer 204 and optionally treated in a manner similar to that shown in FIGS. 2B and 2C. In some embodiments, the seed layer 136 is deposited using CVD, ALD, PVD, or the like. In some embodiments, the deposited seed layer 136 includes an amorphous crystal phase. In some other embodiments, the seed layer 136 is deposited using remote-plasma ALD (RPALD) for supplying thermal stress to form a tetragonal or orthorhombic crystal phase in the seed layer 136. In some embodiments, the seed layer 136 is formed at a temperature between about 200° C. and about 400° C.

In some embodiments, a surface treatment (not separately shown but illustrated as the surface treatment 210 shown in FIG. 2C) is performed on the as-deposited seed layer 136. In embodiments where the seed layer 136 as deposited has an amorphous crystal phase, the surface treatment includes an annealing operation, a plasma treatment or a combination thereof. The surface treatment can supply thermal stress to the entire seed layer 136 to transform the amorphous crystal phase of the seed layer 136 into the tetragonal or orthorhombic crystal phase. The processed seed layer 136 provides a well-controlled crystal structure suitable to serve as a crystallization template and transform the subsequently-formed ferroelectric layer 118 into one having the orthorhombic phase. In some embodiments, the plasma treatment supplies thermal stress through the plasma bombardment for forming the tetragonal or orthorhombic crystal phase at a temperature less than that for the annealing operation. In some embodiments, the surface treatment is performed at a temperature lower than about 400° C., e.g., between about 200° C. and about 400° C. In some embodiments, the deposition and surface treatment 210 are performed in a single operation shown in FIG. 2B, and thus the step shown in FIG. 2C is omitted.

Figure 3D:
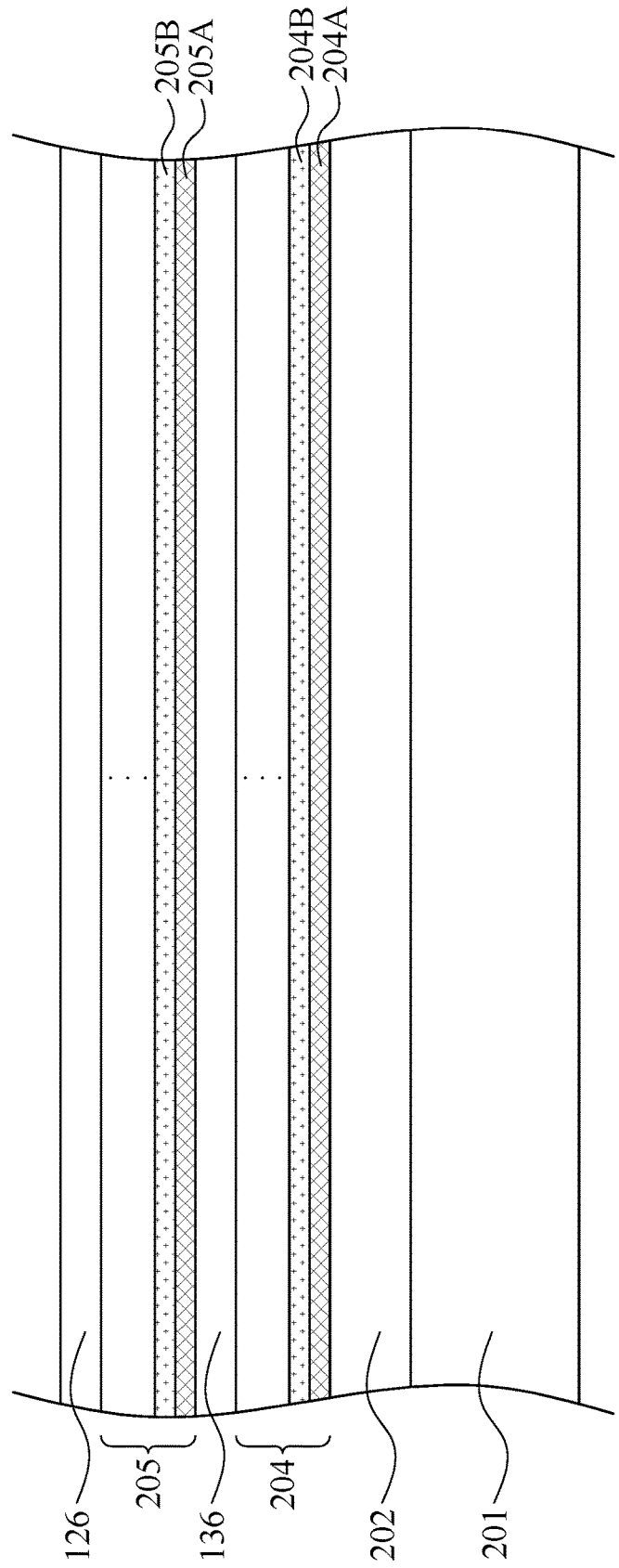

Referring to FIG. 3D, another seed layer 126 is deposited over the dielectric layer 205 and optionally treated in a manner similar to that shown in FIGS. 2B and 2C. Another dielectric layer 205 is deposited over the seed layer 126 in a manner similar to that shown in FIG. 2D. In some embodiments, the dielectric layer 205 is formed of a layer stack formed of a plurality of component layers. For example, a plurality of $HfO_2$ layers 205A are alternatingly arranged with a plurality of dopant layers 205B, in similar materials and configurations to those of the dopants layers 204A and 204B.

In some embodiments, more than one seed layer 136 is deposited and optionally treated during the deposition of the dielectric layers 204 and 205 to form a structure similar to that shown in FIG. 1D. In some embodiments, the seed layer 136 is absent during the manufacturing of the semiconductor structure 300 to form a structure similar to that shown in FIG. 1B. In some embodiments, another seed layer 116 shown in FIG. 2B is incorporated into the semiconductor structure 300 prior to the deposition of the dielectric layer 204.

Figure 3E:
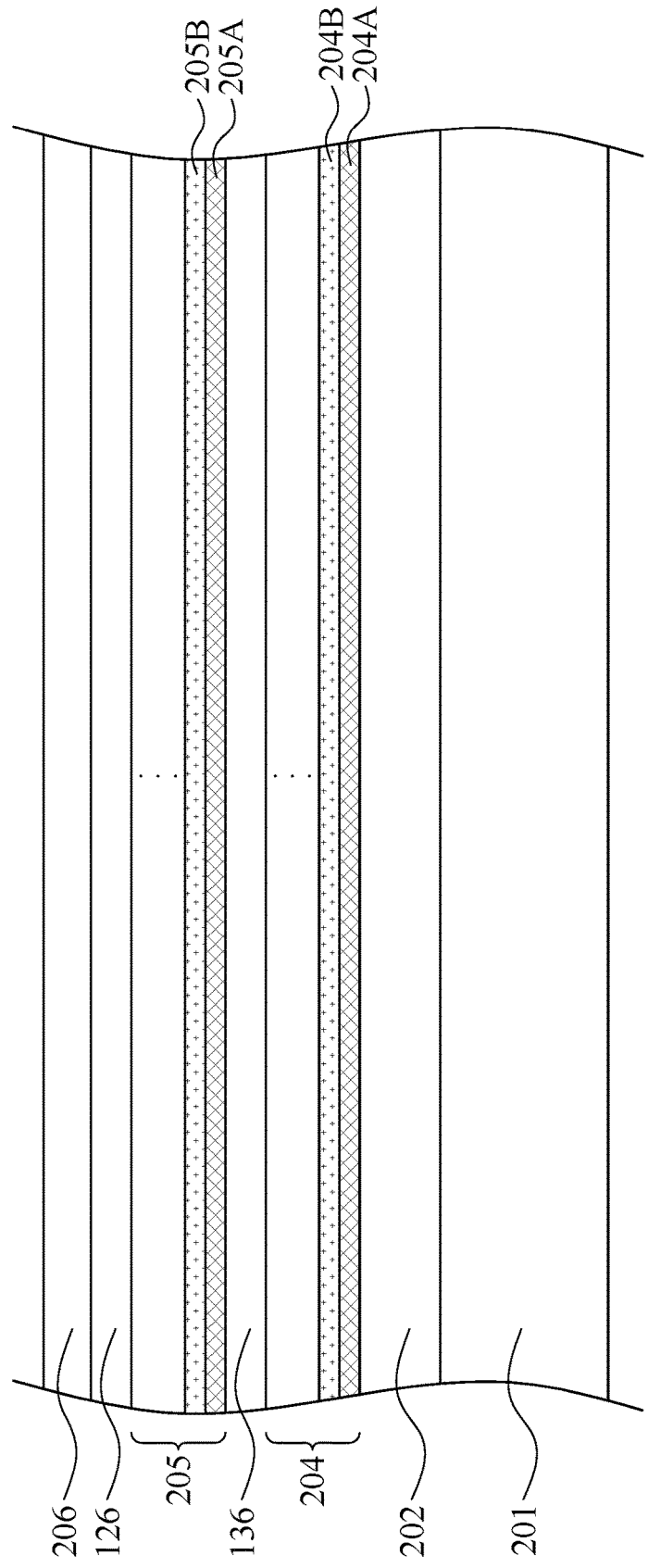
Figure 3F:
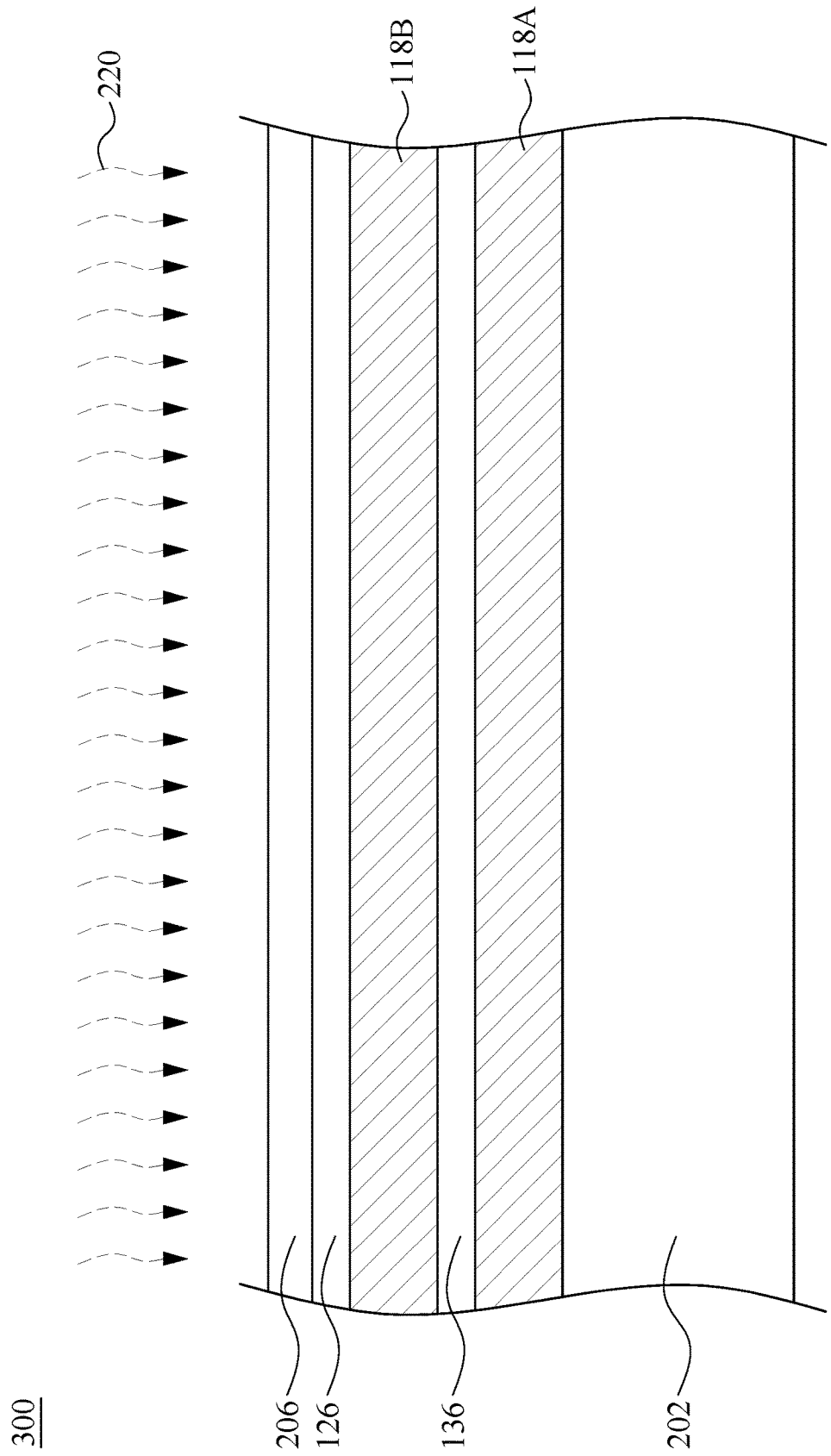

Referring to FIG. 3E, an upper layer 206 is formed over the seed layer 126, in a manner similar to that shown in FIG. 2D. In some embodiments, the upper layer 206 is configured to provide a driving force for facilitating the transformation of the amorphous crystal phase of the dielectric layer 204 into a tetragonal or orthorhombic crystal phase during an annealing operation. Subsequently, FIG. 3F shows a thermal operation 320, in a manner similar to the thermal operation 220 shown in FIG. 2E, for transforming the amorphous crystal phase of the dielectric layers 204 and 205 into an orthorhombic crystal phase. In some embodiments, a cooling operation is performed subsequent to the thermal operation 320. The dielectric layers 204 and 205 are thus transformed into ferroelectric layers 118 or portions 118A and 118B or the ferroelectric layers 118, respectively, as shown in FIGS. 1A to 1D. In some embodiments, the thermal operation 320 is an annealing operation, such as rapid thermal anneal (RTA) or furnace annealing. In some embodiments, the thermal operation is performed at a temperature below about 550° C., such as between about 450° C. and 550° C., e.g., at about 500° C.

FIGS. 4A to 4F are cross-sectional views of intermediate stages of a method for manufacturing a semiconductor structure 400, in accordance with some embodiments of the present disclosure. The semiconductor structure 400 may correspond to the FeRAM devices 100A to 100D shown in FIGS. 1A to 1D. Materials, configurations, dimensions or processes the same as or similar to those described in foregoing embodiments may be applied to the following embodiments, and detailed explanations thereof may be omitted for brevity. It should be understood that additional steps can be provided before, during, and after the steps shown in the following embodiment, and some of the steps described below can be replaced or eliminated in other embodiments. The order of the steps may be interchangeable.

Figure 4A:
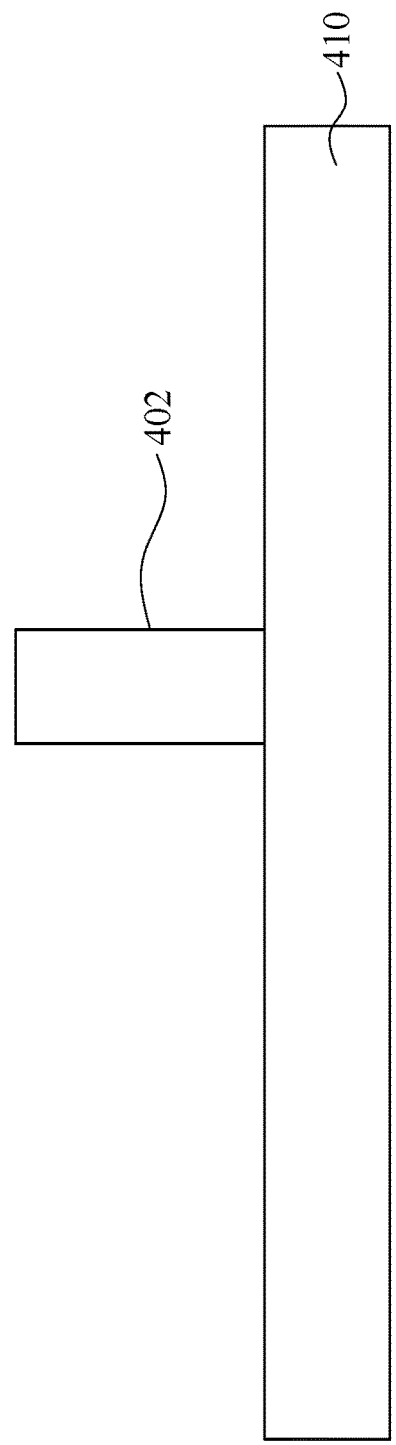
FIGS. 4A to 4F are cross-sectional views of intermediate stages of a method for manufacturing a semiconductor structure, in accordance with some embodiments of the present disclosure.

Referring to FIG. 4A, a substrate 410 is provided or formed. The semiconductor 410 can be a semiconductor wafer formed of silicon, germanium, silicon germanium, silicon carbide, gallium arsenic, indium arsenide, indium phosphide, silicon germanium carbide, gallium arsenic phosphide, gallium indium phosphide, combinations thereof, and the like.

A sacrificial gate electrode 402 is formed over the substrate 410 by, for example, depositing a processing layer followed by a patterning process. In some embodiments, the sacrificial gate electrode 402 includes polysilicon. The processing layer is formed by, for example, deposition or growth by means of CVD, PVD, ALD, epitaxy, sputtering, or some other deposition or growth process. Subsequently, the sacrificial gate electrode 402 is formed by patterning the processing layer. In some embodiments, forming the sacrificial gate electrode 402 includes forming a masking layer over the processing layer and patterning the processing layer according to the masking layer by an etch, e.g., a wet etch or a dry etch. The etch removes unmasked portions of the processing layer, thereby forming the sacrificial gate electrode 402. Subsequently, the masking layer may be stripped away.

In some embodiments, prior to the formation of the sacrificial gate electrode 402, a gate dielectric layer (not shown in FIG. 4A) is formed on the substrate 410. The gate dielectric layer may include, for example, an oxide (e.g., $SiO_2$), a high-k dielectric material (e.g., $HfO_2$, $ZrO_2$, or some other dielectric material with a dielectric constant greater than about 3.9), or a combination thereof.

Figure 4B:
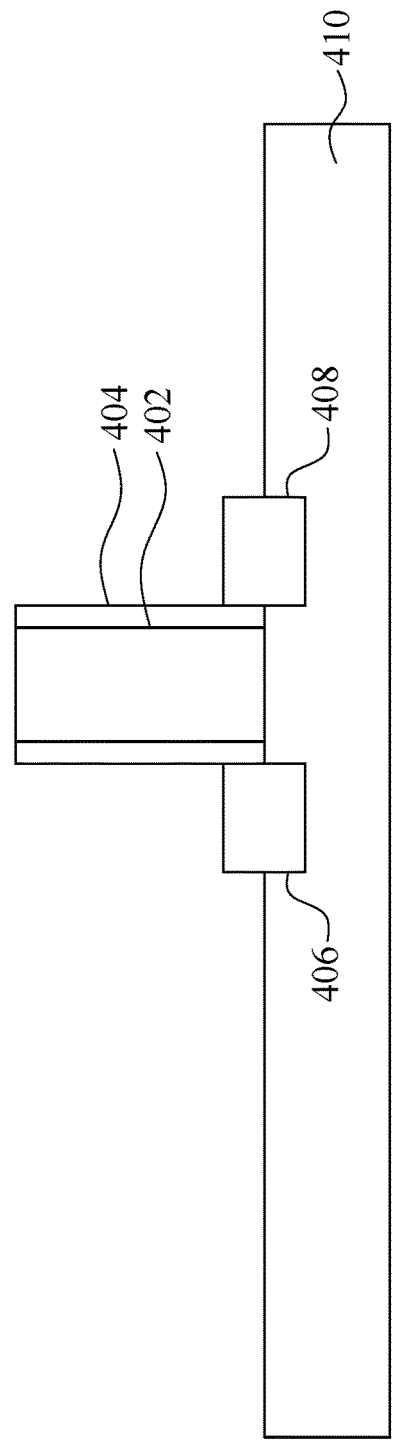

Referring to FIG. 4B, a sidewall spacer 404 is formed over the substrate 410 in FIG. 4A and along sidewalls of the sacrificial gate electrode 402. A spacer layer may be first blanket deposited by PVD, CVD, ALD, sputtering, or some other deposition process. In some embodiments, the spacer layer may include nitride (e.g., SiN), oxynitride (e.g., $SiO_xN_y$), or the like. Subsequently, a patterning operation is performed to remove the portion of the spacer layer from horizontal surfaces of the substrate 410 and the sacrificial gate electrode 402, leaving the sidewall spacer 404 along the sidewalls of the sacrificial gate electrode 402.

Source/drain regions 406 and 408 are formed at least partially in the substrate 410 by, for example, forming a recess in the substrate 410 immediately adjacent to the sacrificial gate electrode 402 and the sidewall spacer 404, and growing an epitaxial layer filling and protruding over the recess. In some embodiments, the epitaxial growth of the source/drain regions 406 and 408 is in-situ doped. However, the present disclosure is not limited thereto. In some embodiments, the source/drain regions 406 and 408 are formed in the substrate 410 by, for example, various ion implantation operations.

Figure 4C:
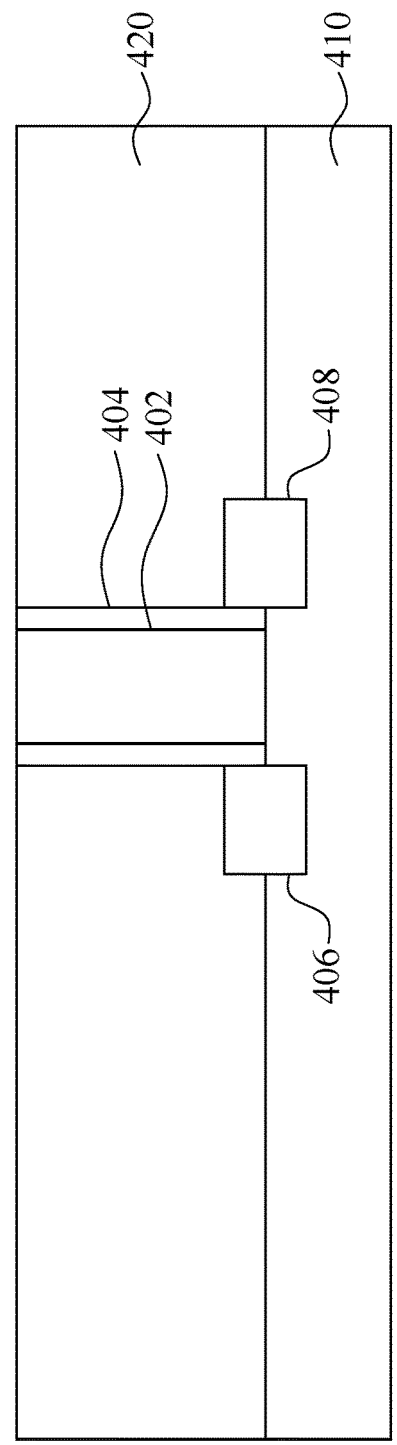

Referring to FIG. 4C, a first interlayer dielectric (ILD) layer 420 is formed over the substrate 410 by, for example, depositing dielectric materials over the substrate 410, the sidewall spacer 404, and the sacrificial gate electrodes 402, followed by a planarization process (e.g., a chemical-mechanical planarization (CMP)) performed on a top of the dielectric materials. The process of dielectric material deposition may include CVD, PVD, or other suitable operations.

Figure 4D:
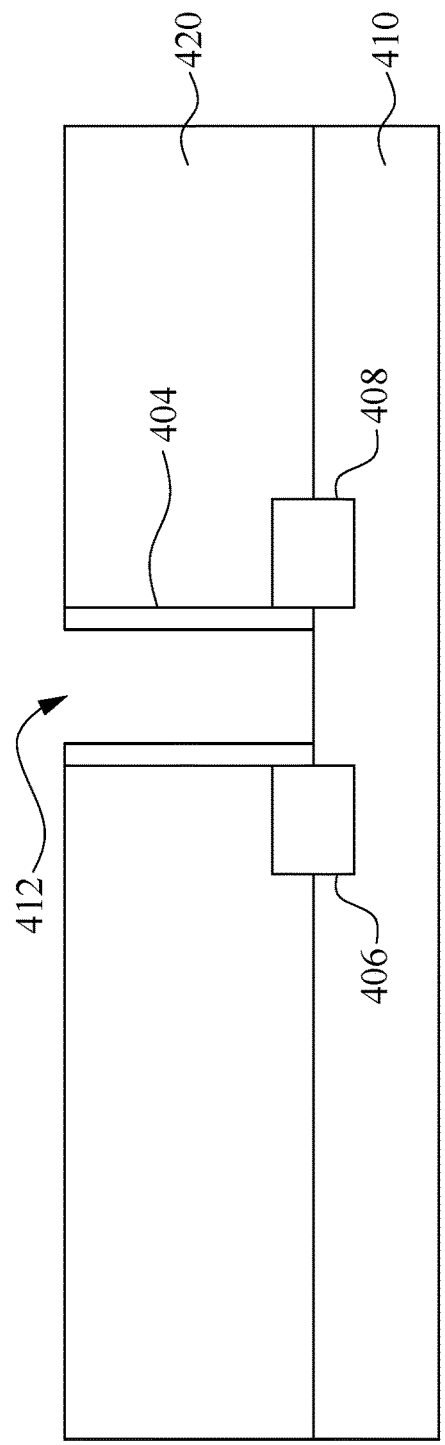

Referring to FIG. 4D, an opening 412 is formed by removing the sacrificial gate electrode 402 in FIG. 4C, exposing a surface of the substrate 410. The opening 412 may be defined by inner sidewalls of the sidewall spacer 404 and the exposed surface of the substrate 410. In some embodiments, a process for removing the sacrificial gate electrode 402 includes performing an etch (e.g., a dry or wet etch) to selectively remove the sacrificial gate electrode 402. In some embodiments, prior to the etch, a masking layer (not shown) may be formed covering the first ILD layer 420 and the sidewall spacer 404, while leaving the sacrificial gate electrode 402 exposed. Thereafter, the etch is performed with the masking layer in place, thereby selectively removing the sacrificial gate electrode 402. Subsequently, the masking layer may be stripped away.

Figure 4E:
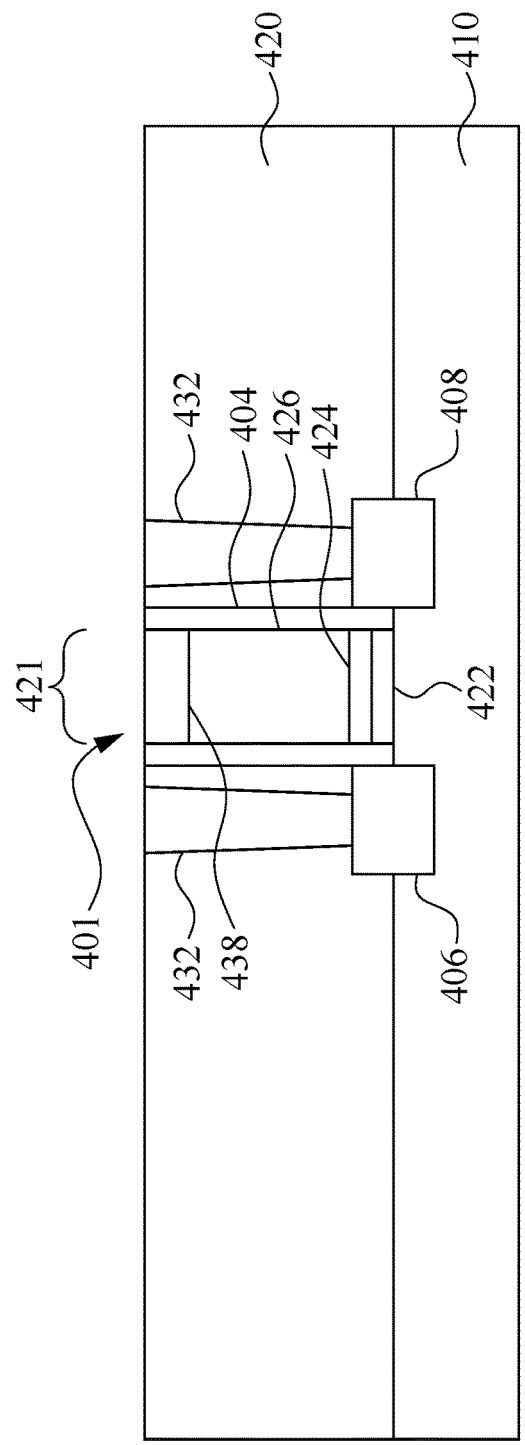

Referring to FIG. 4E, a gate structure 421 is formed by filling the opening 412 in FIG. 4D and over the first ILD layer 420 with various layers. The gate structure 421 may include an interfacial layer 422, a seed layer 424, a ferroelectric layer 426 and a capping layer 428 corresponding to the operations of forming the bottom layer 202, the seed layer 116, the ferroelectric layer 118 and the capping layer 206 shown in FIGS. 2A to 2E. In some embodiments, the process of forming the layers 222, 224, 226 and 228 may include CVD, PVD, ALD, sputtering, electrochemical plating, electroless plating, or some other deposition process. In some embodiments, the layers 222, 224 226 and 228 are formed by depositing a semiconductor layer, followed by an etch operation for thinning the deposited semiconductor material to a thickness as desired. The process of replacing the sacrificial gate electrode 402 with the gate structure 421 as described above may be similar to a replacement gate process or a gate-last high-k/metal gate (HKMG) process, in which the high-k/metal gate materials are replaced by the materials of the seed layer 116, ferroelectric layer 118 and the capping layer 120.

In some embodiments, the gate structure 421 is completed by removing the excess gate materials over the first ILD layer 420 so that the gate structure 421 may be coplanar with a top surface of the first ILD layer 420. As a result, the gate structure 421, the substrate 410 with the source/drain regions 406 and 408 defining an MFIS-type FeFET device 401 is formed.

In some embodiments, the gate structure 421 may be formed by other processes. For example, the gate structure 421 may be formed by a process similar to a gate-first HKMG process. In such cases, the gate structure 421 with its component layers 422, 424, 426 and 428 is formed prior to the formation of the source/drain regions 406 and 408. Further, Although FIG. 4E shows that the FeFET device 401 is formed based on a planar type MOSFET, other types of MOSFET can also be adopted to implement the FeFET device 401, such as a fin-type FET (FinFFT), a gate-all-around (GAA) FET (GAAFET), a nanosheet FET, a nanowire FET, or the like.

Figure 4F:
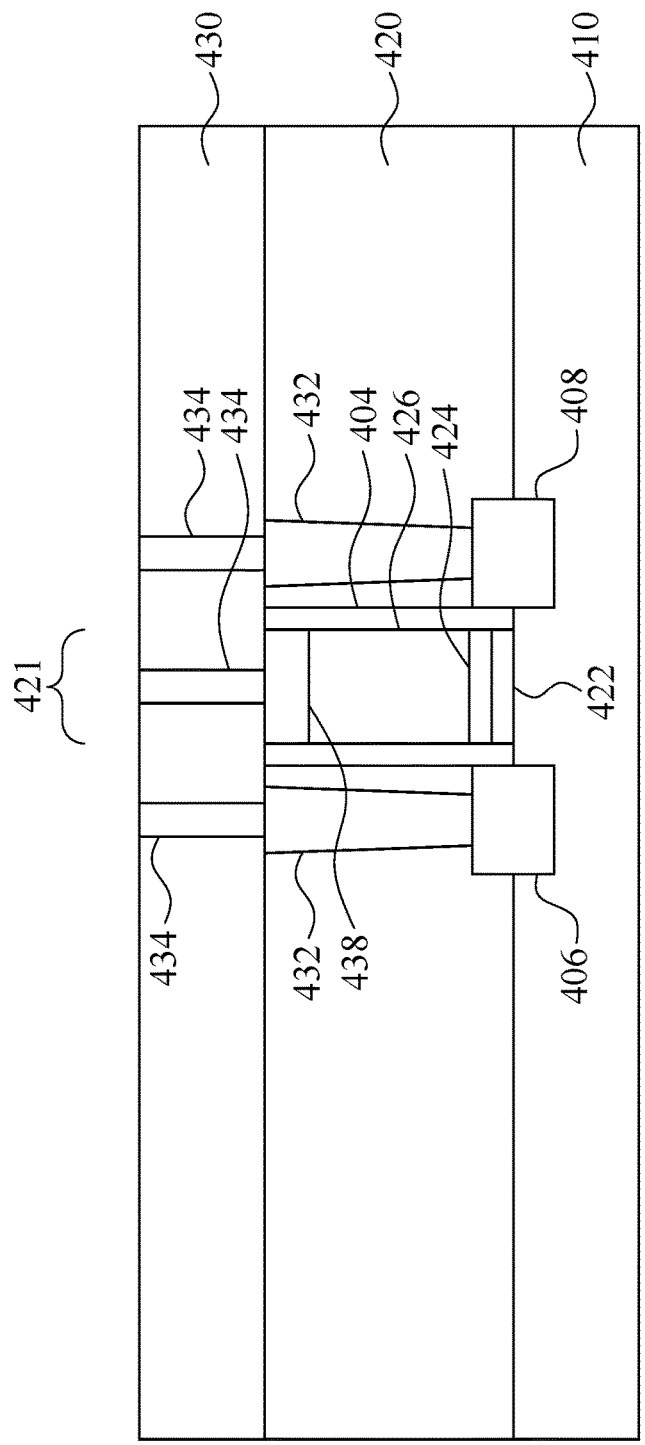

Referring to FIG. 4F, the first ILD layer 410 is patterned to form conductive plugs 432 connecting to the source/drain regions 406 and 408. In some embodiments, an etching operation is performed to form trenches that expose the source/drain regions 406 and 408. Subsequently, a conductive material is deposited or plated into the trenches and over the first ILD layer 420. In some embodiments, a planarization operation, such CMP, is performed to remove the excess conductive materials and level the conductive plugs 432 with the upper surface of the first ILD layer 420.

A second ILD layer 430 is formed over the first ILD layer 420 and patterned with a plurality of conductive vias 434 over the FeFET device. 401. The conductive vias 434 are electrically connected to the conductive plugs 432 and the capping layer 228 of the gate structure 421, respectively. The materials, configurations and method of forming for the second ILD layer 430 with the conductive vias 434 are similar to those for first ILD layer 420 with the conductive plugs 432.

FIGS. 5A to 5F are cross-sectional views of intermediate stages of a method for manufacturing a semiconductor structure 500, in accordance with some embodiments of the present disclosure. Materials, configurations, dimensions or processes the same as or similar to those described in foregoing embodiments may be applied to the following embodiments, and detailed explanations thereof may be omitted for brevity. It should be understood that additional steps can be provided before, during, and after the steps shown in the following embodiment, and some of the steps described below can be replaced or eliminated in other embodiments. The order of the steps may be interchangeable.

Figure 5A:
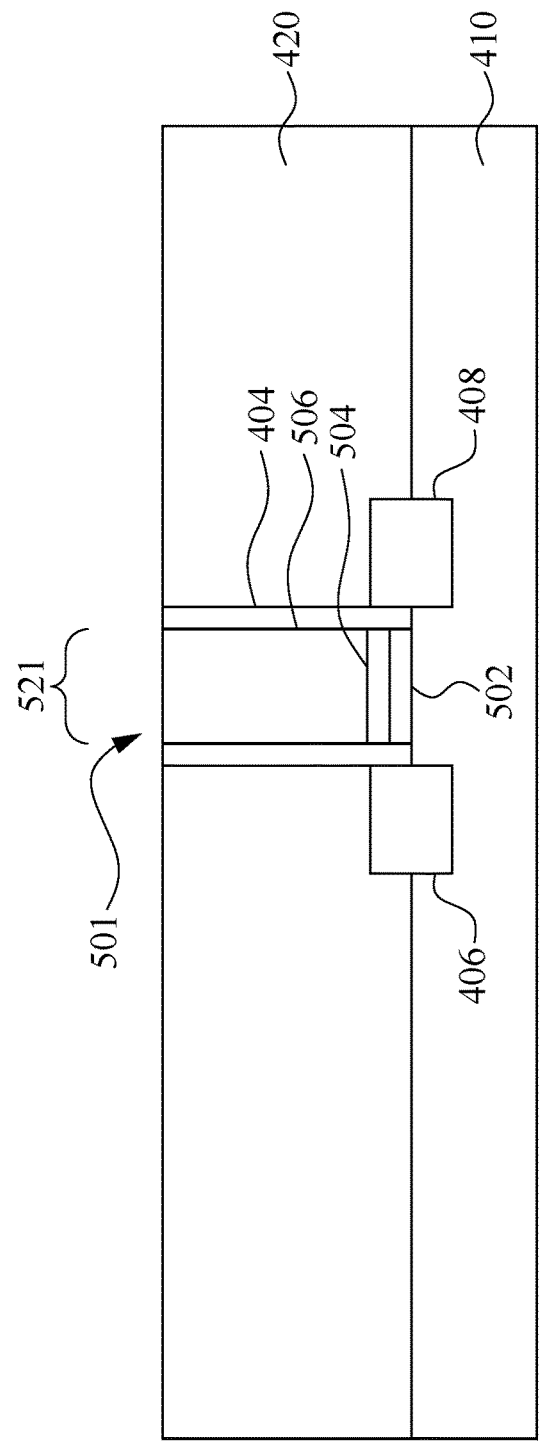
FIGS. 5A to 5F are cross-sectional views of intermediate stages of a method for manufacturing a semiconductor structure, in accordance with some embodiments of the present disclosure.

Referring to FIG. 5A, a substrate 410 is provided. a MOSFET device 501 is formed over the substrate 410, wherein the MOSFET device 501 includes a gate structure 521, a sidewall spacer 404 and source/drain regions 406 and 408. The MOSFET device 501 may be different from the FeFET device 401 shown in FIG. 4E and may not render the function of a memory cell. The MOSFET device 501 is formed in a manner similar to the operations shown in FIGS. 4A to 4E, in which the gate structure 421 is replaced with the gate structure 521.

In some embodiments, the gate structure 521 includes an interfacial layer 502, a gate dielectric layer 504 and a gate electrode layer 506 between the sidewall spacer 404. In some embodiments, the configuration and method of forming for the interfacial layer 502 is similar to those of the interfacial layer 422. In some embodiments, the gate dielectric layer 504 includes a high-k dielectric material, such as $HfO_2$, HfErO, HfLaO, HfYO, HfGdO, HfAlO, HfZrO, HfTiO, HfTaO, $ZrO_2$, $Y_2O_3$, $La_2O_5$, $Gd_2O_5$, $TiO_2$, $Ta_2O_5$, SrTiO, or combinations thereof. In some embodiments, the gate dielectric layer 504 has an amorphous crystal phase to provide dielectric property during operation. The gate dielectric layer 504 may be formed by CVD, PVD, ALD, PECVD, or other deposition processes.

The gate electrode layer 506 may include one or more conductive layers, such as a barrier layer, a work function layer and a filling layer. The barrier layer may comprise titanium, titanium nitride, tantalum, tantalum nitride, other suitable materials, or combinations thereof. The work function layer may include Ti, Ag, Al, TiAl, TiAlN, TiAlC, TaC, TaCN, TaSiN, TaAlC, Mn, Zr, a combination thereof, or the like, for an n-type MOSFET device 501, or include TiN, WN, TaN, Ru, Co, a combination thereof, or the like, for a p-type MOSFET device 501. In some embodiments, the filling layer may include conductive materials such as Co, Ru, Al, Ag, Au, W, Ni, Ti, Cu, Mn, Pd, Re, Ir, Pt, Zr, a combination thereof, or the like. In some embodiments, the barrier layer, work function layer and the filling layer are deposited by suitable deposition processes such as ALD, CVD, PVD, plating, sputtering, or the like.

Figure 5B:
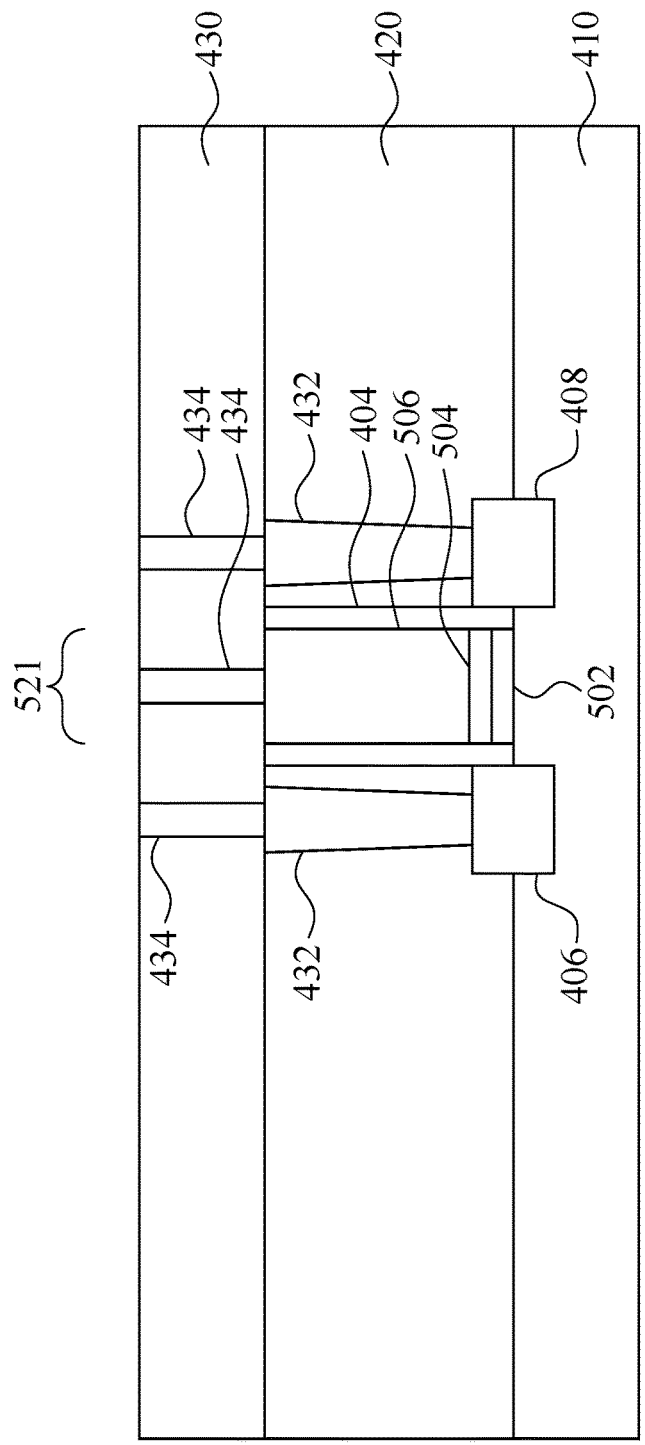

Referring to FIG. 5B, the first ILD layer 410 is patterned to form conductive plugs 432 in a manner similar to that described with reference to FIG. 4F. Likewise, a second ILD layer 430 is formed over the first ILD layer 420 and patterned with a plurality of conductive vias 434 electrically connected to the source/drain regions 406 and 408 and the gate electrode layer 506, respectively, of the MOSFET device 501.

Figure 5C:
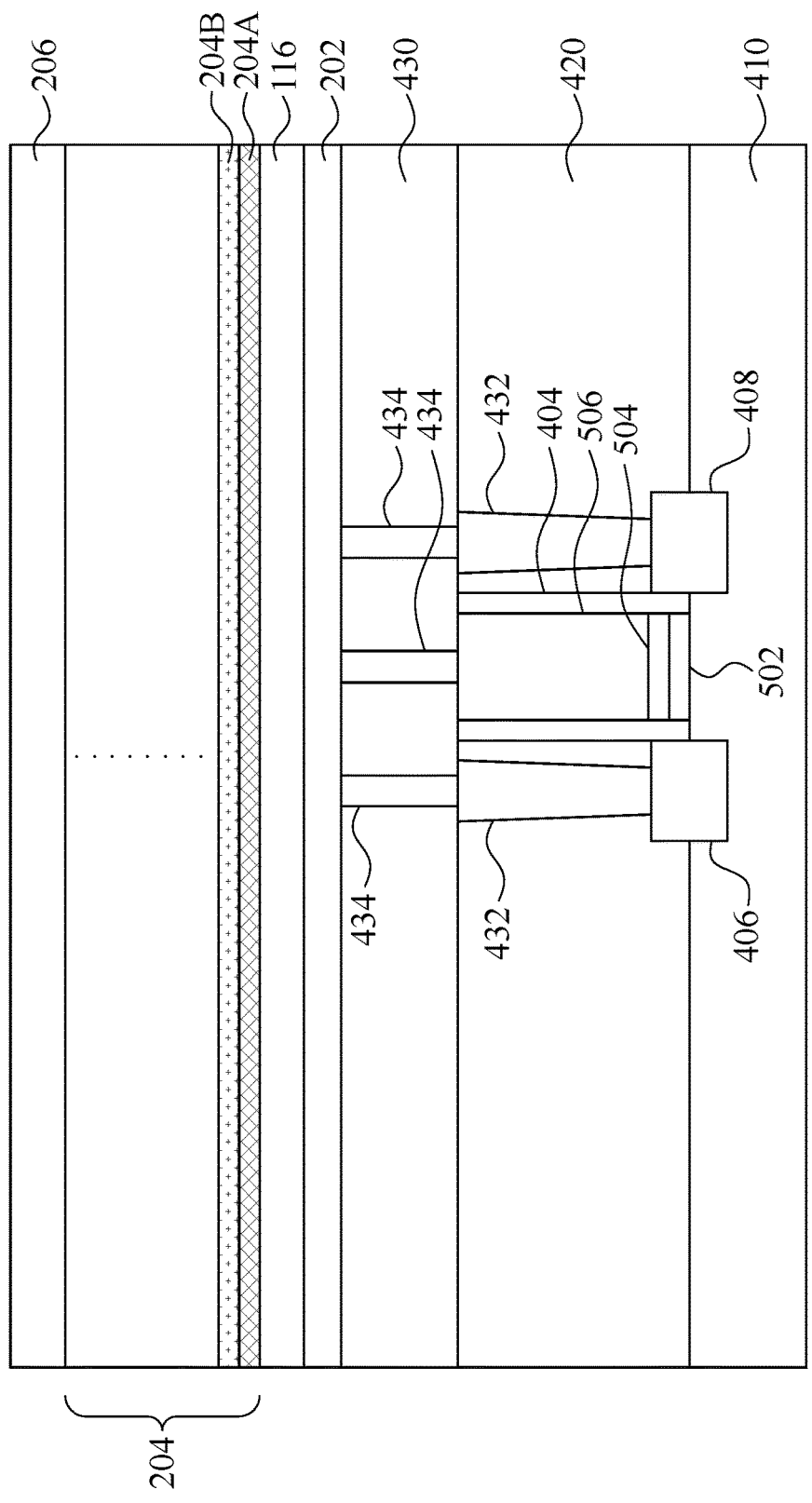
Figure 5D:
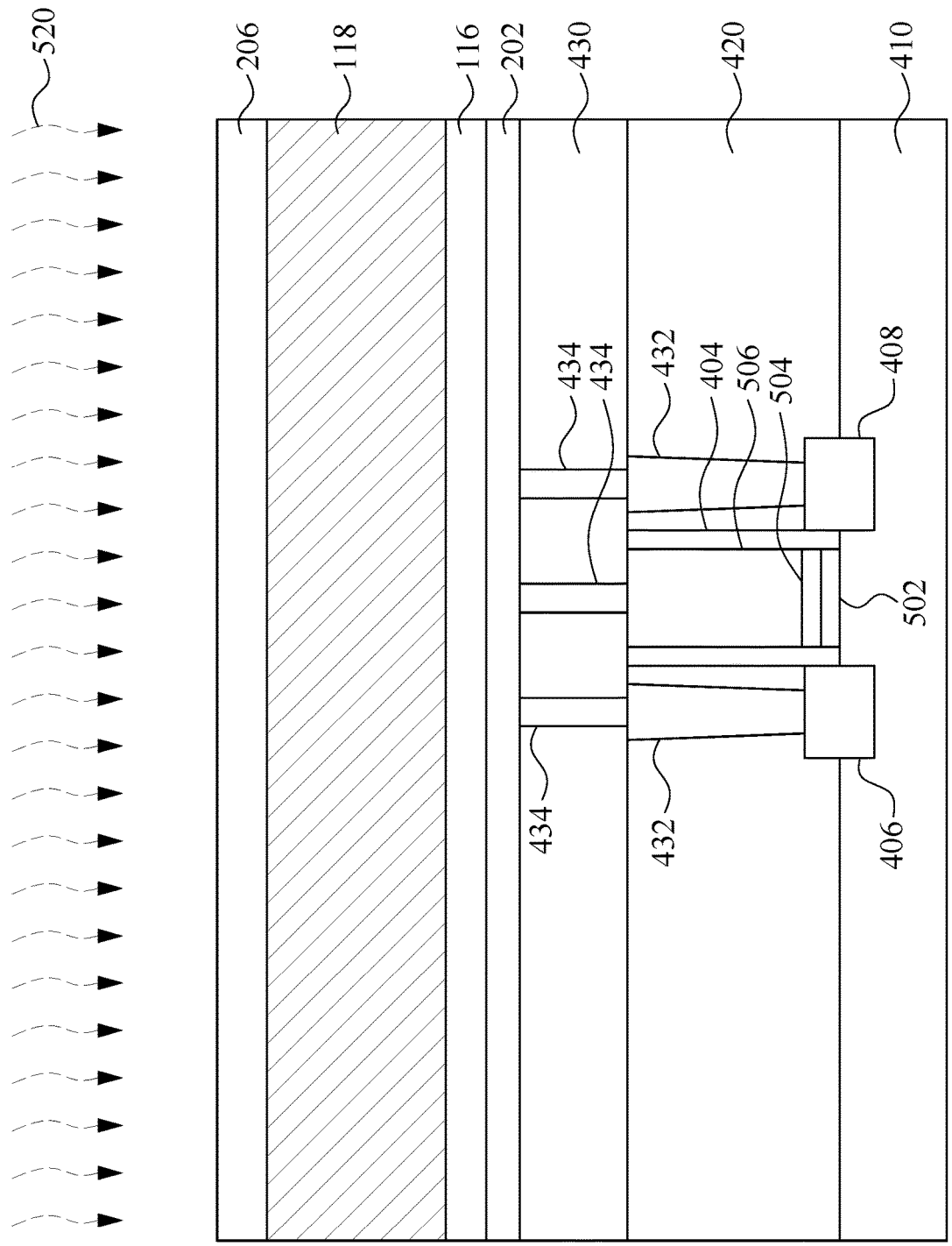
Figure 5E:
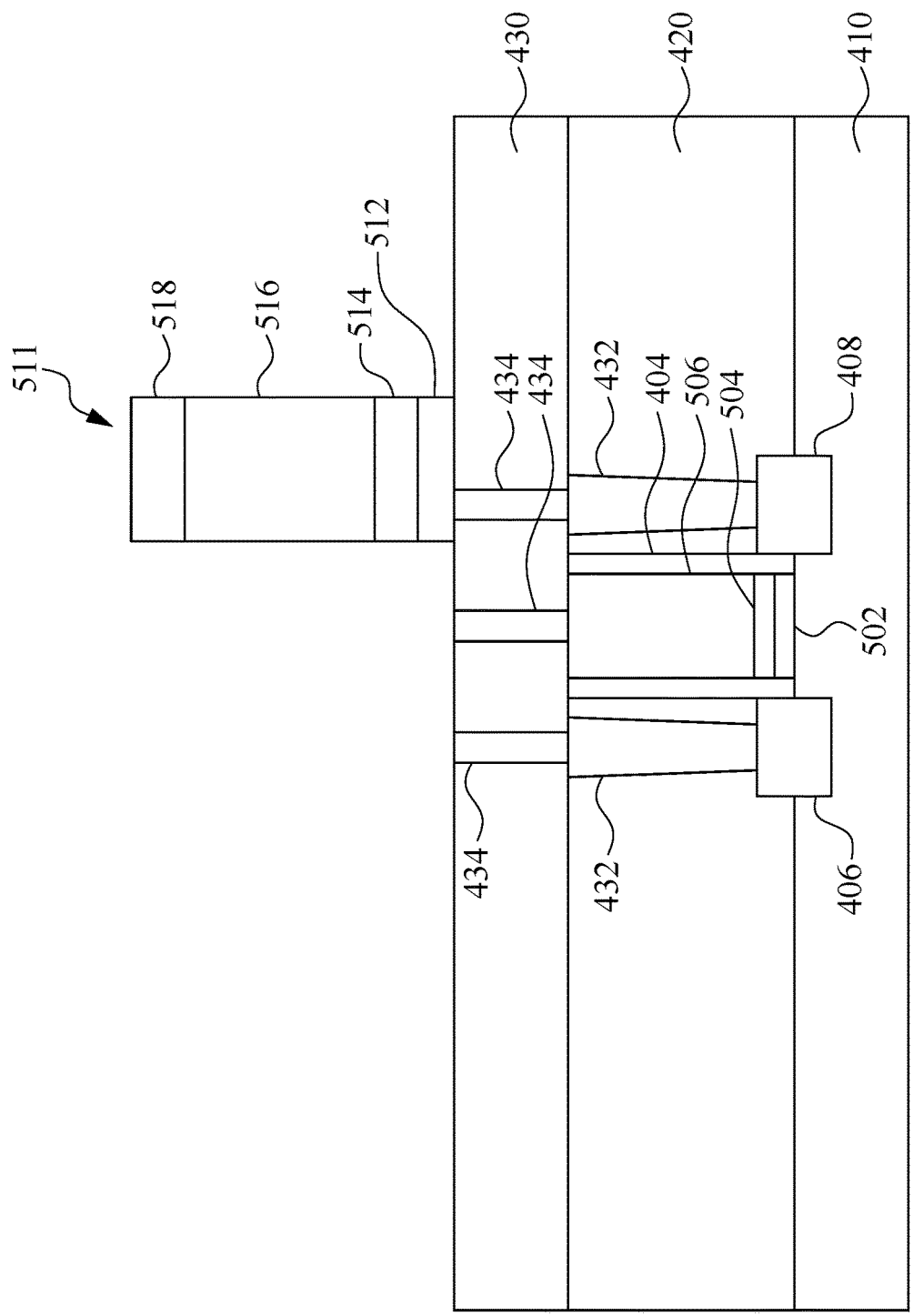

FIGS. 5C to 5E illustrates the formation of a Metal-Ferroelectric-Metal (MFM) type FeRAM device 511 over the MOSFET device 501. Referring to FIG. 5C, a bottom layer 202, a seed layer 106, a dielectric layer 204 and an upper layer 206 are formed over the second ILD layer 430. The method of forming the bottom layer 202, the seed layer 106, the dielectric layer 204 and the upper layer 206 are explained with reference to FIGS. 2A to 2D, and detailed descriptions thereof are omitted for brevity. In some embodiments, the bottom layer 202 includes a conductive material serving as an electrode of the MFM-type FeRAM device 511. The bottom layer 202 in the present embodiment may include titanium nitride (TiN), tantalum nitride (TaN), tungsten (W), ruthenium (Ru), or the like.

Referring to FIG. 5D, a thermal operation 520 is performed to transform the dielectric layer 204 into a ferroelectric layer or a ferroelectric dielectric layer 118, in a manner similar to the thermal operation 220 shown in FIG. 2E. In some embodiments, a cooling operation is performed after the thermal operation 520. Subsequently, the layer stack formed of the bottom layer 202, the seed layer 116, the ferroelectric layer 118 and the upper layer 206 are patterned to form a bottom electrode 512, a seed layer 514, a ferroelectric layer 516 and a top electrode 518, respectively, as shown in FIG. 5E. The FeRAM device 511 is formed accordingly. In some embodiments, the bottom electrode 512 and the top electrode 218 serve as a bottom electrode and a top electrode, respectively, of the FeRAM device 511. In some embodiments, forming the FeRAM device 511 includes forming a masking layer over the upper layer 206 and patterning the underlying layer stack formed of the upper layer 206, the ferroelectric layer 118, the seed layer 116 and the bottom layer 202 according to the masking layer by an etch, e.g., a wet etch or a dry etch. The etch removes unmasked portions of the processing layer, thereby forming the FeRAM device 511. Subsequently, the masking layer may be stripped away. In some embodiments, more than one etch operations are required to perform the patterning operation of the FeRAM device 511.

The arrangement of the bottom layer 202, the seed layer 116, the dielectric layer 204 and the upper layer 206 for the FeRAM device 511 as shown in FIGS. 5C to 5D are only for illustrational purposes. Other combinations and variants of the seed layer 116 are also within the contemplated scope of the present disclosure. For example, the arrangements of the seed layers 116, 126 and 136 described with reference to FIGS. 1A to 1D for the MFIS-type FeRAM devices 100A to 100D are also applicable to the MFM-type FeRAM device 511, in which one or more seed layers 116, 126 and 136 can be arranged below, over and embedded within the dielectric layer 204.

Figure 5F:
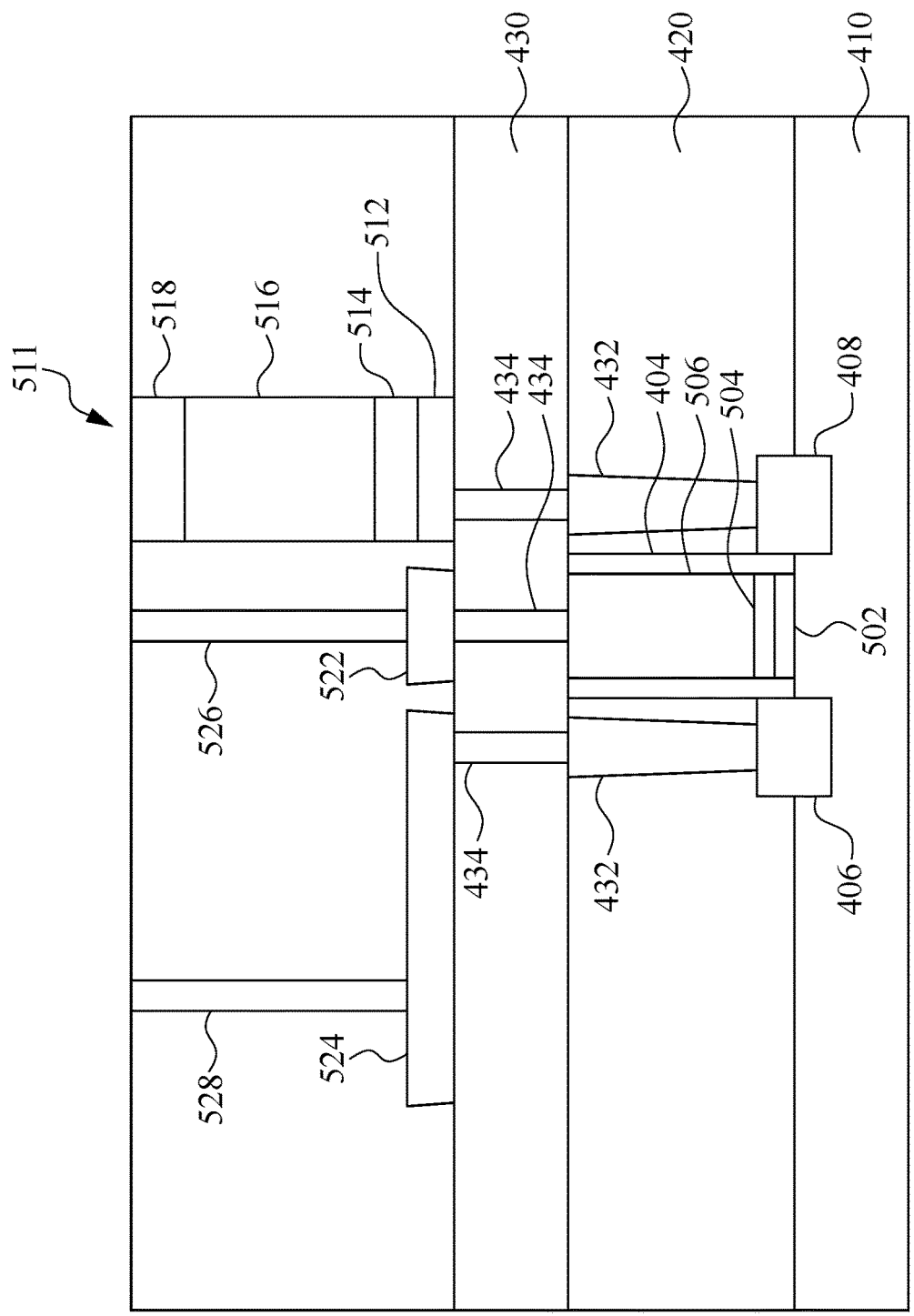

Referring to FIG. 5F, conductive lines 522 and 524 are formed adjacent to the FeRAM device 511 over the first ILD layer 420. The conductive lines 522 and 524 are electrically connected to the gate electrode layer 506 and the source/drain region 406 through the conductive vias 434. Conductive vias 526 and 528 are formed to electrically connect the conductive lines 522 and 524 to overlying features (not shown). A third ILD layer 540 is formed over the second ILD layer 430 and laterally surrounds the FeRAM device 511, the conductive lines 522 and 544 and the conductive vias 526 and 528. The materials, configurations, dimensions and method of forming for the third ILD layer 540 and the conductive lines 522, 524 and the conductive vias 526, 528 are similar to those of the first ILD layer 420 and the conductive plugs 432.

The MOSFET device 501 and the FeRAM device 511 may be electrically connected to constitute a memory cell, in which the MOSFET device 501 is configured to receive read/write control signal to perform a read or write operation on the FeRAM device 511. The FeRAM device 511 is also referred to a ferroelectric tunnel junction (FTJ) device. The bottom electrode 512 is electrically connected to one source/drain region 408 while the top electrode 518 is electrically connected to a biasing circuit (not separately shown). During operation, an electric field is generated between the two sides of the ferroelectric layer 516 through biasing the bottom electrode 212 and the top electrode 218 during a read or write operation.

In some embodiments, the substrate 410 and the first ILD layer 420 are referred to as the transistor layer of the semiconductor structure 500. The second ILD layer 430 along with the conductive vias 434 is referred to as a first metal via layer of the semiconductor structure 500, while the third ILD layer 540 along with the features in the third ILD layer 540 may be referred to as a first metal line layer of the semiconductor structure 500. As previously discussed, the semiconductor structure 500 may include more than one metal layers over the transistor layer and interconnected through the intervening metal via layers. Although the present example illustrates the FeRAM device 511 disposed in the first metal line layer, the alternative arrangements are also possible, e.g., the FeRAM device 511 is disposed in a third or fourth metal line layer and electrically connected to the MOSFET device 501 through the intervening metal line layers and metal via layers.

Figure 6A:
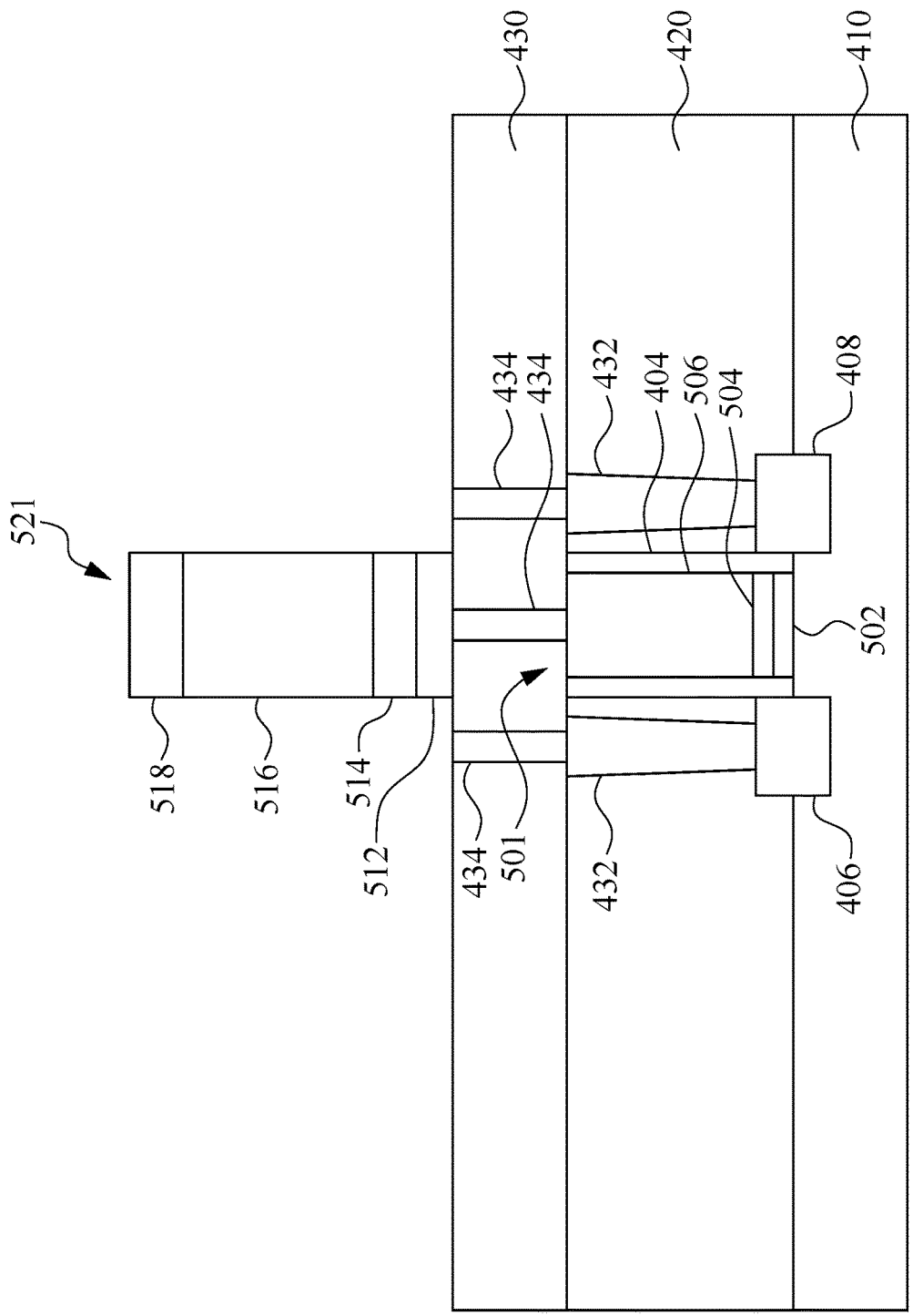
FIGS. 6A to 6B are cross-sectional views of intermediate stages of a method for manufacturing a semiconductor structure, in accordance with some embodiments of the present disclosure.
Figure 6B:
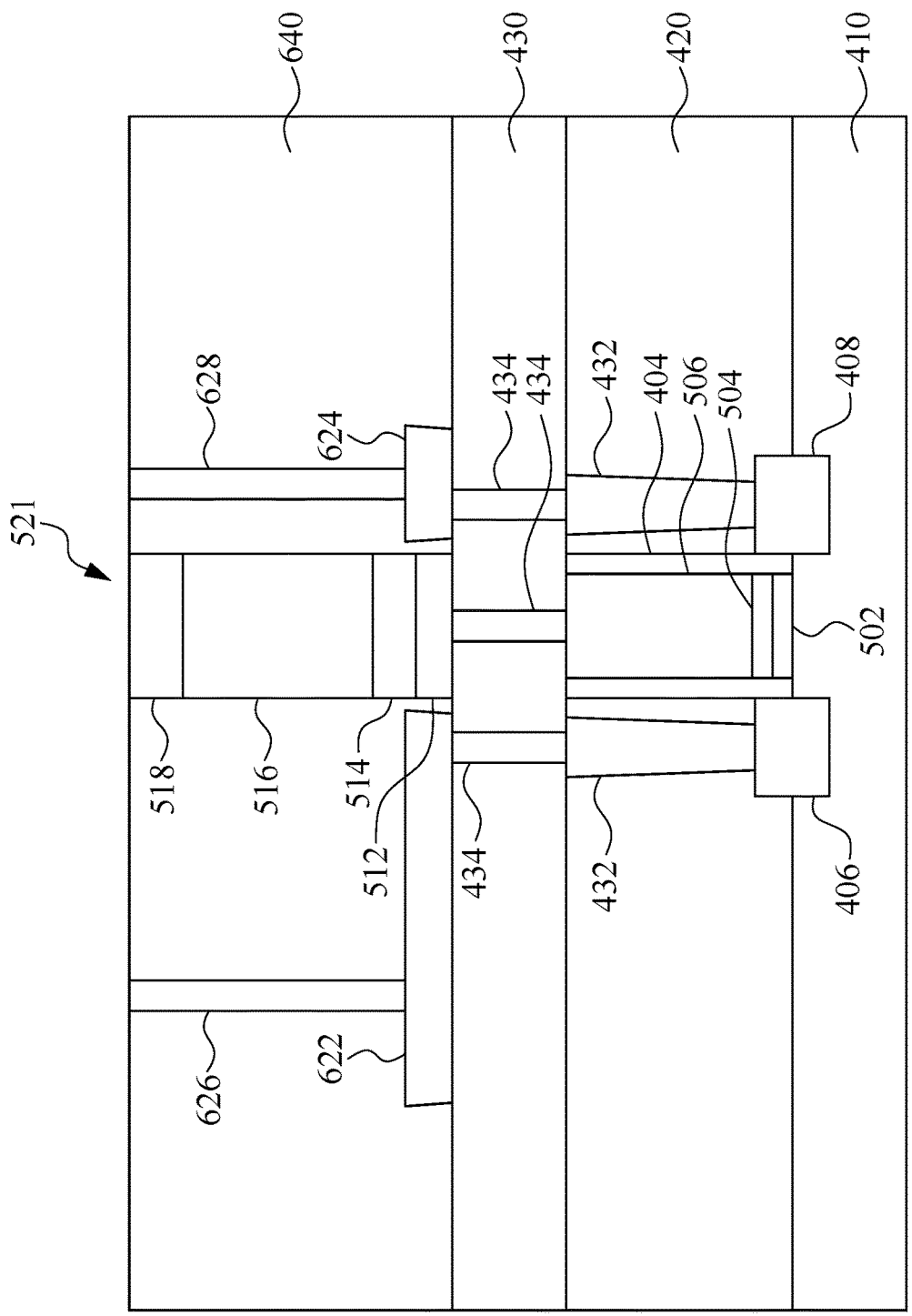

FIGS. 6A to 6B are cross-sectional views of intermediate stages of a method for manufacturing a semiconductor structure 600, in accordance with some embodiments of the present disclosure. Materials, configurations, dimensions or processes the same as or similar to those described in foregoing embodiments may be applied to the following embodiments, and detailed explanations thereof may be omitted for brevity. It should be understood that additional steps can be provided before, during, and after the steps shown in the following embodiment, and some of the steps described below can be replaced or eliminated in other embodiments. The order of the steps may be interchangeable.

FIG. 6A illustrates the formation of a FeRAM device 521 in similar manners to those shown in FIGS. 5A to 5E. The FeRAM device 521 is similar to the FeRAM device 511 shown in FIG. 5E. The MOSFET device 501 and the FeRAM device 521 may be electrically connected to constitute a memory cell, in which the MOSFET device 501 is configured to receive read/write control signal to perform a read or write operation on the FeRAM device 511. A difference between FIG. 5E and FIG. 6A lies in that the bottom electrode 512 of the FeRAM device 521 is electrically connected to the gate electrode layer 506 of the MOSFET device 501. During operation, an electric field is generated between the two sides of the ferroelectric layer 516 through biasing the bottom electrode 212 and the top electrode 218 during a read or write operation. The FeRAM device 521 is also referred to a FeFET device.

Referring to FIG. 6B, conductive lines 622 and 624 are formed adjacent to the FeRAM device 521 over the first ILD layer 420. The conductive lines 622 and 624 are electrically connected to the source/drain regions 406 and 408 through the conductive vias 434. Conductive vias 626 and 628 are formed to electrically connect the conductive lines 622 and 624 to overlying features (not shown). A fourth ILD layer 640 is formed over the second ILD layer 430 and laterally surrounds the FeRAM device 521, the conductive lines 622 and 644 and the conductive vias 626 and 628. The materials, configurations, dimensions and method of forming for the fourth ILD layer 640 and the conductive lines 622, 624 and the conductive vias 626, 628 are similar to those of the first ILD layer 420 and the conductive plugs 432.

According to an embodiment, a method includes: forming a first transistor over a substrate; forming a bottom electrode over the transistor; depositing a first seed layer over the bottom electrode; performing a surface treatment on the first seed layer, wherein after the surface treatment the first seed layer includes at least one of a tetragonal crystal phase and an orthorhombic crystal phase; depositing a dielectric layer over the bottom layer adjacent to the first seed layer, the dielectric layer including an amorphous crystal phase; depositing an upper layer over the dielectric layer; performing a thermal operation on the dielectric layer to thereby convert the dielectric layer into a ferroelectric layer.

According to an embodiment, a method includes: forming a bottom electrode layer over a substrate; depositing a first seed layer over the bottom electrode layer, the first seed layer having an amorphous crystal phase; performing a first treatment onto the first seed layer, wherein after the first treatment the first seed layer has an orthorhombic crystal phase; depositing a layer stack over the first seed layer, the layer stack including a plurality of first dielectric layers and a plurality of second dielectric layers alternatingly arranged with the first dielectric layers; forming a capping layer over the layer stack; transforming the layer stack into a ferroelectric layer; and performing a patterning operation on the bottom electrode, the first seed layer and the layer stack.

According to an embodiment, a method includes: forming a first transistor over a substrate; forming a conductive via electrically coupled to the transistor; depositing a seed layer having an amorphous crystal phase over the conductive via; treating a surface of the seed layer, wherein after the treating the seed layer includes an oxide form of a first element and having at least one of a tetragonal crystal phase and an orthorhombic crystal phase; depositing a stack of dielectric layers over the seed layer; depositing a capping layer over the stack of dielectric layers; performing a thermal operation on the stack of dielectric layers at a temperature at which the conductive via functions properly; and cooling the stack of dielectric layers to thereby cause the stack of dielectric layers to be a ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first transistor over a substrate;
   forming a bottom electrode over the first transistor;
   depositing a first seed layer over the bottom electrode;
   performing a first surface treatment on the first seed layer, wherein after the first surface treatment the first seed layer includes at least one of a tetragonal crystal phase and an orthorhombic crystal phase;
   depositing a dielectric layer over the bottom electrode adjacent to the first seed layer, the dielectric layer including an amorphous crystal phase;
   depositing an upper layer over the dielectric layer; and
   performing a thermal operation on the dielectric layer to thereby convert the dielectric layer into a ferroelectric layer.

2. The method according to claim 1, wherein the first seed layer is deposited over the dielectric layer.

3. The method according to claim 1, wherein the first seed layer comprises a thickness less than about 2 nm.

4. The method according to claim 1, wherein the first surface treatment comprises a plasma-based annealing operation.

5. The method according to claim 1, wherein the first surface treatment is performed at a temperature less than about 400° C.

6. The method according to claim 1, wherein the dielectric layer is deposited on the first seed layer after the first surface treatment is performed.

7. The method according to claim 1, wherein the depositing of the dielectric layer comprises:
   depositing a first portion of the dielectric layer over the bottom electrode;
   depositing a second seed layer over the first portion of the dielectric layer; and
   depositing a second portion of the dielectric layer over the second seed layer.

8. The method according to claim 7, further comprising performing a second surface treatment on the second seed layer prior to the depositing of the second portion of the dielectric layer.

9. The method according to claim 1, wherein the thermal operation is performed at a temperature between about 450° C. and about 550° C.

10. The method according to claim 1, wherein the dielectric layer comprises an oxide form of a metallic material.

11. A method, comprising:
    forming a bottom electrode layer over a substrate;
    depositing a first seed layer over the bottom electrode layer, the first seed layer having an amorphous crystal phase;
    performing a first treatment onto the first seed layer, wherein after the first treatment the first seed layer has an orthorhombic crystal phase;
    depositing a layer stack over the first seed layer, the layer stack including a plurality of first dielectric layers and a plurality of second dielectric layers alternatingly arranged with the first dielectric layers;
    forming a capping layer over the layer stack;
    transforming the layer stack into a ferroelectric layer; and
    performing a patterning operation on the bottom electrode layer, the first seed layer and the layer stack.

12. The method according to claim 11, further comprising forming at least one second seed layer in the layer stack, wherein each of the at least one second seed layer has an orthorhombic crystal phase or a tetragonal crystal phase prior to the first treatment.

13. The method according to claim 11, wherein the first dielectric layers comprise $HfO_2$ and the second dielectric layers comprise $ZrO_2$.

14. The method according to claim 11, wherein the transforming comprises performing a thermal operation and a cooling operation such that at least a portion of the first seed layer becomes a portion of the ferroelectric layer.

15. The method according to claim 11, wherein the first seed layer is formed of at least one of $ZrO_2$, $Al_2O_3$, $SiO_2$ and MgO.

16. The method according to claim 11, further comprising forming a third seed layer over the layer stack and performing a second treatment on the third seed layer to cause a tetragonal crystal phase or an orthorhombic crystal phase in the third seed layer prior to depositing the capping layer.

17. A method, comprising:
    forming a transistor over a substrate;
    forming a first conductive via electrically coupled to the transistor;
    depositing a seed layer having an amorphous crystal phase over the first conductive via;
    treating a surface of the seed layer, wherein after the treating the seed layer includes an oxide form of a first element and having at least one of a tetragonal crystal phase and an orthorhombic crystal phase;
    depositing a stack of dielectric layers over the seed layer;
    depositing a capping layer over the stack of dielectric layers;
    performing a thermal operation on the stack of dielectric layers at a temperature at which the first conductive via functions properly; and
    cooling the stack of dielectric layers to thereby cause the stack of dielectric layers to be a ferroelectric layer.

18. The method of claim 17, wherein the first element is selected from group IV.

19. The method of claim 17, wherein the stack of dielectric layers is in physical contact with the seed layer.

20. The method of claim 17, further comprising forming a conductive line and a second conductive via over the conductive line, wherein the second conductive via is adjacent to the ferroelectric layer.

\* \* \* \* \*